(12) United States Patent
Yang et al.

(10) Patent No.: US 12,482,763 B2
(45) Date of Patent: Nov. 25, 2025

(54) SEMICONDUCTOR DEVICE PACKAGE AND METHODS OF FORMATION

(71) Applicant: Taiwan Semiconductor Manufacturing Company, Ltd., Hsinchu (TW)

(72) Inventors: Tien-Chung Yang, Hsinchu (TW); Li-Hsien Huang, Zhubei (TW); Ming-Feng Wu, Miaoli County (TW); Yung-Sheng Liu, Hsinchu (TW); Chun-Jen Chen, Jhubei (TW); Jun He, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 589 days.

(21) Appl. No.: 17/814,997

(22) Filed: Jul. 26, 2022

(65) Prior Publication Data

US 2024/0038682 A1 Feb. 1, 2024

(51) Int. Cl.
| | |
|---|---|
| *H01L 21/78* | (2006.01) |
| *H01L 21/56* | (2006.01) |
| *H01L 21/66* | (2006.01) |
| *H01L 23/00* | (2006.01) |
| *H01L 23/31* | (2006.01) |

(Continued)

(52) U.S. Cl.
CPC .......... *H01L 23/562* (2013.01); *H01L 21/561* (2013.01); *H01L 21/78* (2013.01); *H01L 22/12* (2013.01); *H01L 23/3128* (2013.01); *H01L 23/49811* (2013.01); *H01L 24/97* (2013.01); *H01L 25/105* (2013.01)

(58) Field of Classification Search
None
See application file for complete search history.

(56) References Cited

U.S. PATENT DOCUMENTS

| 10,153,237 B2 | 12/2018 | Ho et al. |
| 11,367,658 B2 | 6/2022 | Chang et al. |

(Continued)

FOREIGN PATENT DOCUMENTS

| CN | 105448866 A | 3/2016 |
| TW | 200625505 A | 7/2006 |

(Continued)

*Primary Examiner* — Jay C Chang
(74) *Attorney, Agent, or Firm* — Harrity & Harrity, LLP

(57) ABSTRACT

A laser grooving operation is performed to form a plurality of grooves in a semiconductor die prior to attaching the semiconductor die to a semiconductor device package substrate. In addition to forming a first groove through which blade sawing is to be performed to separate the semiconductor die from other semiconductor dies, a second groove may be formed between the first groove and a seal ring of the semiconductor die. The second groove is configured to contain any potential delamination that might otherwise propagate to an active region of the semiconductor die. Accordingly, the second groove and the associated laser grooving operation described herein may reduce the likelihood of delamination that might otherwise be caused by swelling and/or expansion in a molding compound formed around the semiconductor die after the semiconductor die is attached to the semiconductor device package substrate.

20 Claims, 38 Drawing Sheets

(51) Int. Cl.
*H01L 23/498* (2006.01)
*H01L 25/10* (2006.01)

(56) References Cited

U.S. PATENT DOCUMENTS

| | | | |
|---|---|---|---|
| 2010/0013043 A1 | 1/2010 | Liu et al. | |
| 2013/0267076 A1* | 10/2013 | Lei | B23K 26/40 |
| | | | 438/460 |
| 2017/0271276 A1* | 9/2017 | Ho | H01L 24/13 |
| 2017/0294391 A1 | 10/2017 | Lin et al. | |
| 2021/0035878 A1 | 2/2021 | Jin et al. | |

FOREIGN PATENT DOCUMENTS

| | | |
|---|---|---|
| TW | 201342496 A | 10/2013 |
| TW | 201735382 A | 10/2017 |
| TW | 202121634 A | 6/2021 |

\* cited by examiner

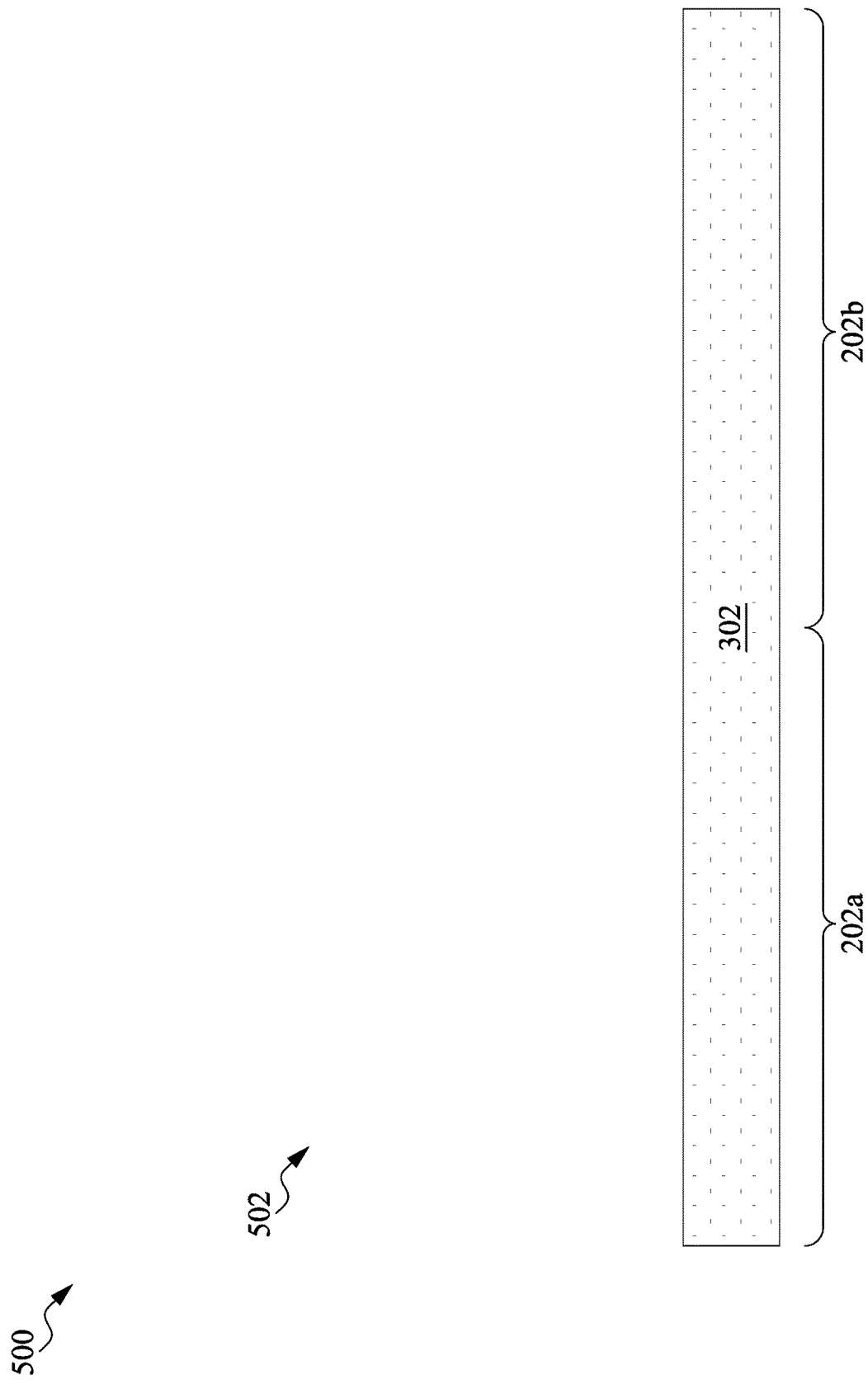

SEMICONDUCTOR DEVICE PACKAGE AND METHODS OF FORMATION

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to stack semiconductor dies in a semiconductor device package may include package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5I are diagrams of an example implementation described herein.

DETAILED DESCRIPTION

Figure 1:
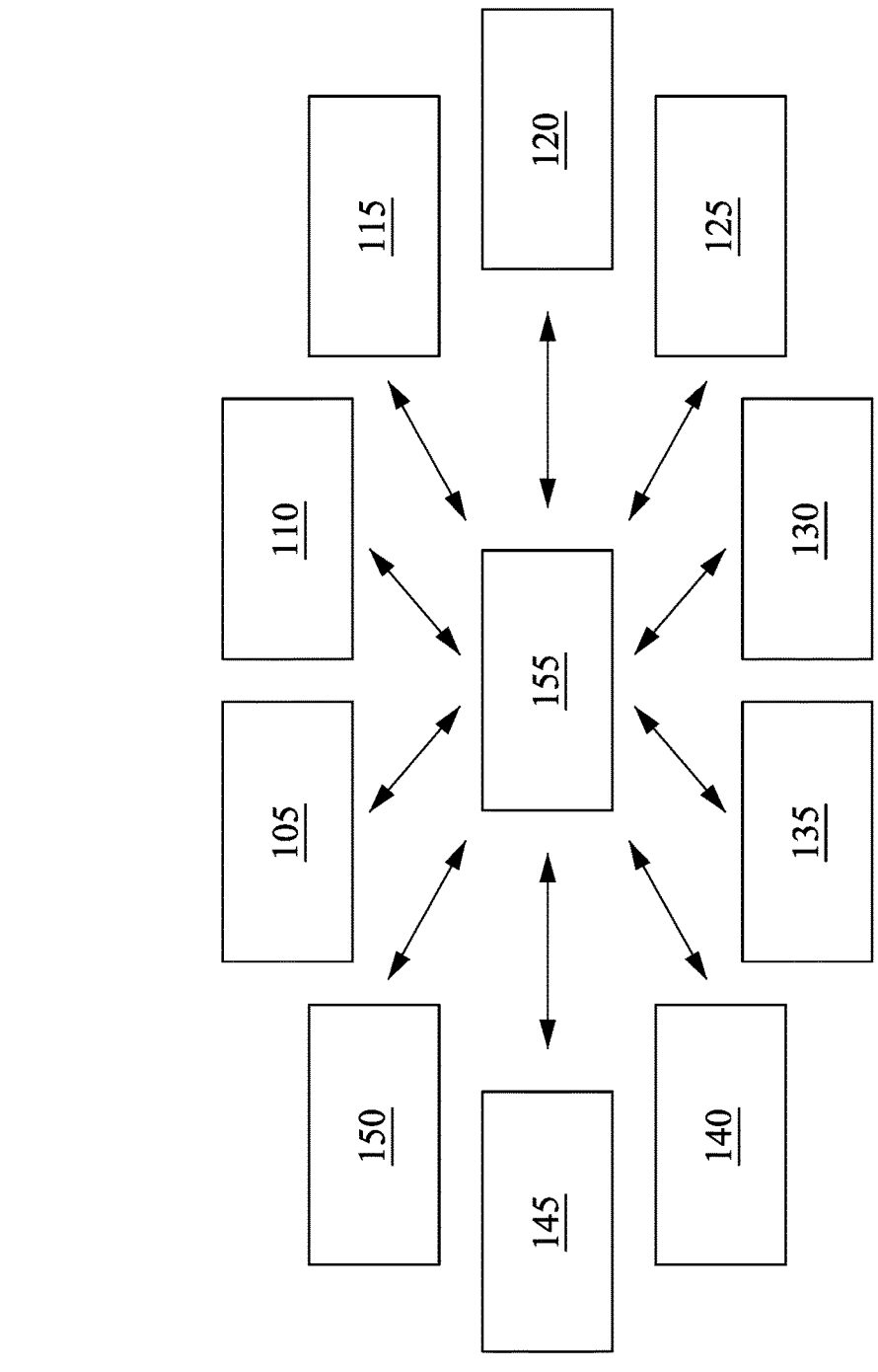
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "cupper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the process of packaging semiconductor dies into a semiconductor device package, a plurality of semiconductor dies may be formed on a substrate and then cut into individual pieces. Laser grooving can be performed to form grooves in the semiconductor die prior to blade sawing to cut the plurality of semiconductor dies into individual pieces. A semiconductor die of the plurality of semiconductor dies may be attached to a semiconductor device package substrate and then encapsulated with a molding compound. The molding compound fills in around the semiconductor die, including the grooves that were formed during the laser grooving process.

After the grooves are filled with the molding compound, the molding compound may be exposed to high temperatures and/or high moisture during reliability testing. These exposures can cause the molding compound to swell and/or expand, which may transfer stress to the semiconductor die through the grooves. The stress may cause delamination in the semiconductor die, where the stress physically causes two or more layers of the semiconductor die to crack or separate. Delamination may cause failures in the semiconductor die, which may cause failures in the semiconductor device package and may reduce semiconductor device package yield.

In some implementations described herein, a laser grooving operation is performed to form a plurality of grooves (or recesses) in a semiconductor die prior to attaching the semiconductor die to a semiconductor device package substrate. In addition to forming a first groove through which blade sawing is to be performed to separate the semiconductor die from other semiconductor dies, a second groove may be formed between the first groove and a seal ring of the semiconductor die. The second groove is configured to contain any potential delamination to a portion of the semiconductor die between the first groove and the second groove, and prevents delamination from propagating through the seal ring and into an active region of the semiconductor die. Accordingly, the second groove and the associated laser grooving operation described herein reduce the likelihood of delamination in the semiconductor die that might otherwise be caused by swelling and/or expansion in a molding compound formed around the semiconductor die after the semiconductor die is attached to the semiconductor device package substrate. This may reduce the likelihood of failures in the semiconductor die, which may increase semiconductor device package yield.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a combination of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such as a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 5A-5I, 6A-6G, 7A-7H, and/or 8A-8F, among other examples. As another example, one or more of the semiconductor processing tool sets 105-150 may form a first semiconductor die package and a second semiconductor die package, side-by-side with the first semiconductor die package, on a wafer; may form a first groove in a scribe line region between the first semiconductor die package and the second semiconductor die package; may form a second groove in the scribe line region; may form a third groove in the scribe line region, where the second groove is adjacent to a first side of the first groove that faces the first semiconductor die package, where the third groove is adjacent to a second side of the first groove that faces the second semiconductor die package, where a width of the first groove is greater relative to a width of the second groove, and where the width of the first groove is greater relative to a width of the third groove; and/or may cut through a bottom of the first groove to separate the first semiconductor die package and the second semiconductor die package.

As another example, one or more of the semiconductor processing tool sets 105-150 may mount the first semiconductor die package to a carrier substrate; may form a plurality of through integrated fanout (InFO) vias (TIVs) of a semiconductor device package adjacent to one or more sides of the first semiconductor die package; and/or may deposit a molding compound around the first semiconductor die package and around the plurality of TIVs, where the molding compound fills in the second groove to form a stress relief trench in the first semiconductor die package.

As another example, one or more of the semiconductor processing tool sets may perform one or more reliability tests on the semiconductor device package, where the stress relief trench resists a transfer of stress from the molding compound to the semiconductor device package that results from swelling of the molding compound during the one or more reliability tests.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
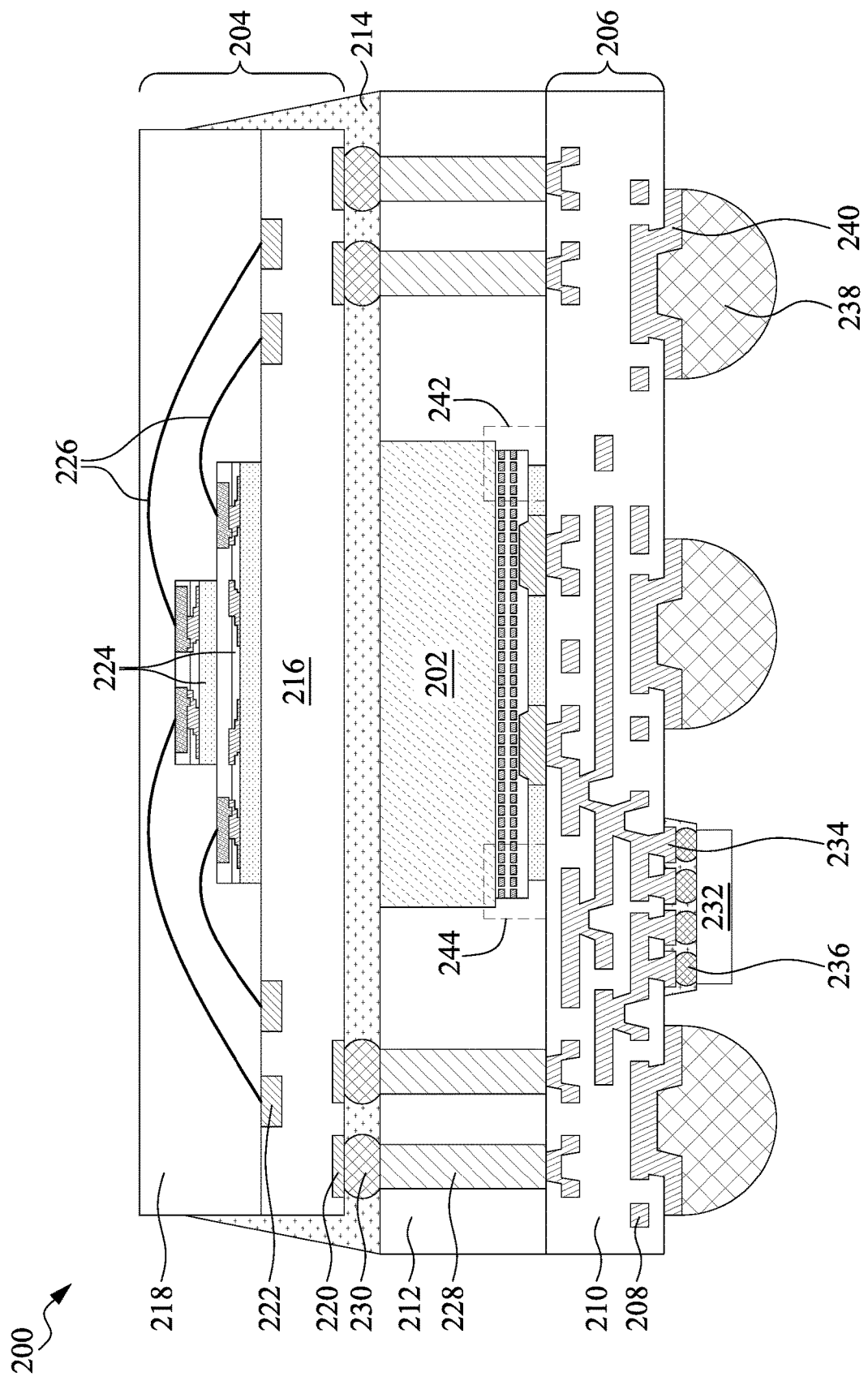
FIG. 2 is a diagram of an example semiconductor device package described herein.

FIG. 2 is a diagram of an example semiconductor device package 200 described herein. The semiconductor device package 200 includes a packaged semiconductor device that includes one or more semiconductor die packages. The semiconductor device package 200 may be referred to as a package on package (PoP) semiconductor device package, a 3D package, a 2.5D package, an integrated fanout (InFO) package, and/or another type of semiconductor device package that includes one or more semiconductor die packages.

As shown in FIG. 2, the semiconductor device package 200 may include a semiconductor die package 202 and a semiconductor die package 204. The semiconductor die package 202 and the semiconductor die package 204 may be stacked or vertically arranged in the semiconductor device package 200. In particular, the semiconductor die package 204 may be included over the semiconductor die package 202. Each of the semiconductor die packages 202 and 204 may include one or more semiconductor dies, such as a logic die, a system-on-chip (SoC) die, a memory die, an input/output (I/O) die, and/or another type of semiconductor die.

Each of the semiconductor die packages 202 and 204 may include one or more other structures, such as a substrate, an interposer, and/or connection structures, among other examples described herein.

The semiconductor die package 202 may be included over and/or on a semiconductor device package substrate 206. The semiconductor device package substrate 206 may include one or more metallization layers 208 disposed in one or more dielectric layers 210. The semiconductor device package substrate 206 may include a redistribution structure (e.g., a redistribution layer (RDL) structure), an interposer, and/or another type of package substrate. The semiconductor die package 202 may be attached to one or more metallization layers 208 of the semiconductor device package substrate 206.

The one or more metallization layer 208 of the semiconductor device package substrate 206 may include one or more materials such as a gold (Au) material, a copper (Cu) material, a silver (Ag) material, a nickel (Ni) material, a tin (Sn) material, and/or a palladium (Pd) material, among other examples. The one or more metallization layers 208 of the semiconductor device package substrate 206 may include metal lines, vias, interconnects, and/or another type of metallization layers that enable fanout of I/O connections on the semiconductor die packages 202 and 204. The dielectric layers 210 may include polybenzoxazole (PBO), polyimide, benzocyclobutene (BCB), silicon oxide ($SiO_x$), and/or another suitable dielectric material.

An encapsulation layer 212 may be included over and/or on the semiconductor device package substrate 206. The encapsulation layer 212 may surround and/or encapsulate the semiconductor die package 202. The encapsulation layer 212 may include a molding compound, such as a polymer, one or more fillers dispersed in a resin, an epoxy-based resin, and/or another type of insulating material. An underfill material 214 may be included over the semiconductor die package 202 and over the encapsulation layer 212. The underfill material 214 may be included to fill in the gaps between the semiconductor die package 202 and the semiconductor die package 204. The underfill material 214 may a polymer, one or more fillers dispersed in a resin, an epoxy-based resin, and/or another type of insulating material.

The semiconductor die package 204 may include a substrate 216 and an encapsulation layer 218 over and/or on the substrate 216. The substrate 216 may include bottom connection structures 220 and top connection structures 222. The top connection structures 222 may be electrically connected with semiconductor dies 224 of the semiconductor die package 204. The semiconductor dies 224 may include a memory die, such as a high band width memory (HBM) die, a static random access memory (SRAM) die, a dynamic random access memory (DRAM) die, and/or another type of memory die. Additionally and/or alternatively, the semiconductor dies 224 may include another type of semiconductor die, such as a logic die, an I/O die, and/or another type of semiconductor die.

The semiconductor dies 224 and the top connection structures 222 may be electrically connected by a plurality of bonding wires 226. The encapsulation layer 218 encapsulates the semiconductor dies 224 and the bonding wires 226. The bottom connection structures 220 electrically connect the semiconductor die package 204 to a plurality of TIVs 228 that extend through the encapsulation layer 212 and between the semiconductor device package substrate 206 and the semiconductor die package 204. The bottom connection structures 220, the top connection structures 222, and the TIVs 228 may include one or more materials such as a gold (Au) material, a copper (Cu) material, a silver (Ag) material, a nickel (Ni) material, a tin (Sn) material, and/or a palladium (Pd) material, among other examples. The bottom connection structures 220 and the TIVs 228 may be electrically connected by connectors 230, which may include solder balls, solder bumps, controlled collapse chip connection (C4) bumps, and/or micro bumps, among other examples.

As further shown in FIG. 2, the semiconductor device package 200 may include an integrated passive device (IPD) 232 that is connected to bottom side of the semiconductor device package substrate 206 opposing a side of the semiconductor device package substrate 206 to which the semiconductor die package 202 is attached. The IPD 232 may include one or more capacitors, one or more resistors, one or more inductors, and/or one or more passive components of another type. The IPD 232 may be attached to the bottom side of the semiconductor device package substrate 206 by bonding pads 234, which are electrically connected to the metallization layers 208 of the semiconductor device package substrate 206, and connectors 236.

The semiconductor device package 200 may include conductive terminals 238 that are attached to the bottom side of the semiconductor device package substrate 206 by conductive pads 240. The conductive terminals 238 may include ball grid array (BGA) balls, land grid array (LGA) pads, pin grid array (PGA) pins, and/or another type of conductive terminals. The conductive terminals 238 may enable the semiconductor device package 200 to be mounted to a circuit board, a socket (e.g., an LGA socket), and/or another type of mounting structure. The conductive pads 240 may be electrically connected to the metallization layers 208 of the semiconductor device package substrate 206.

As described herein, end portions 242 and 244 of the semiconductor die package 202 may include a stress relief trench between an outer edge of the semiconductor die package 202 and a seal ring structure of the semiconductor die package 202. The stress relief trench extends into and/or through one or more layers of the semiconductor die package 202 in the end portions 242 and 244, such as insulator layer, a connection structure, and/or into a portion of a semiconductor die of the semiconductor die package 202. The stress relief trench may be included in a bottom surface of the semiconductor die package 202 that faces the semiconductor device package substrate 206 and faces away from the semiconductor die package 204. Delamination may occur in one or more layers of the scribe line regions in the end portions 242 and/or 244 due to stress that is exerted on the end portions 242 and/or 244. The stress may result, for example, due to expansion and/or swelling of the encapsulation layer 212 if the molding compound of the encapsulation layer 212 is exposed to high heat and/or high humidity. The stress relief trench is configured to reduce a likelihood of delamination in the end portions 242 and 244 from propagating from a scribe line region of the semiconductor die package 202 and into an active region of the semiconductor die package 202 through the seal ring region. This may prevent or reduce the likelihood of a delamination in the end portions 242 and 244 causing device failures in the semiconductor die package 202.

As indicated above, FIG. 2 is provided as an example. Other examples may differ from what is described with regard to FIG. 2.

Figure 3:
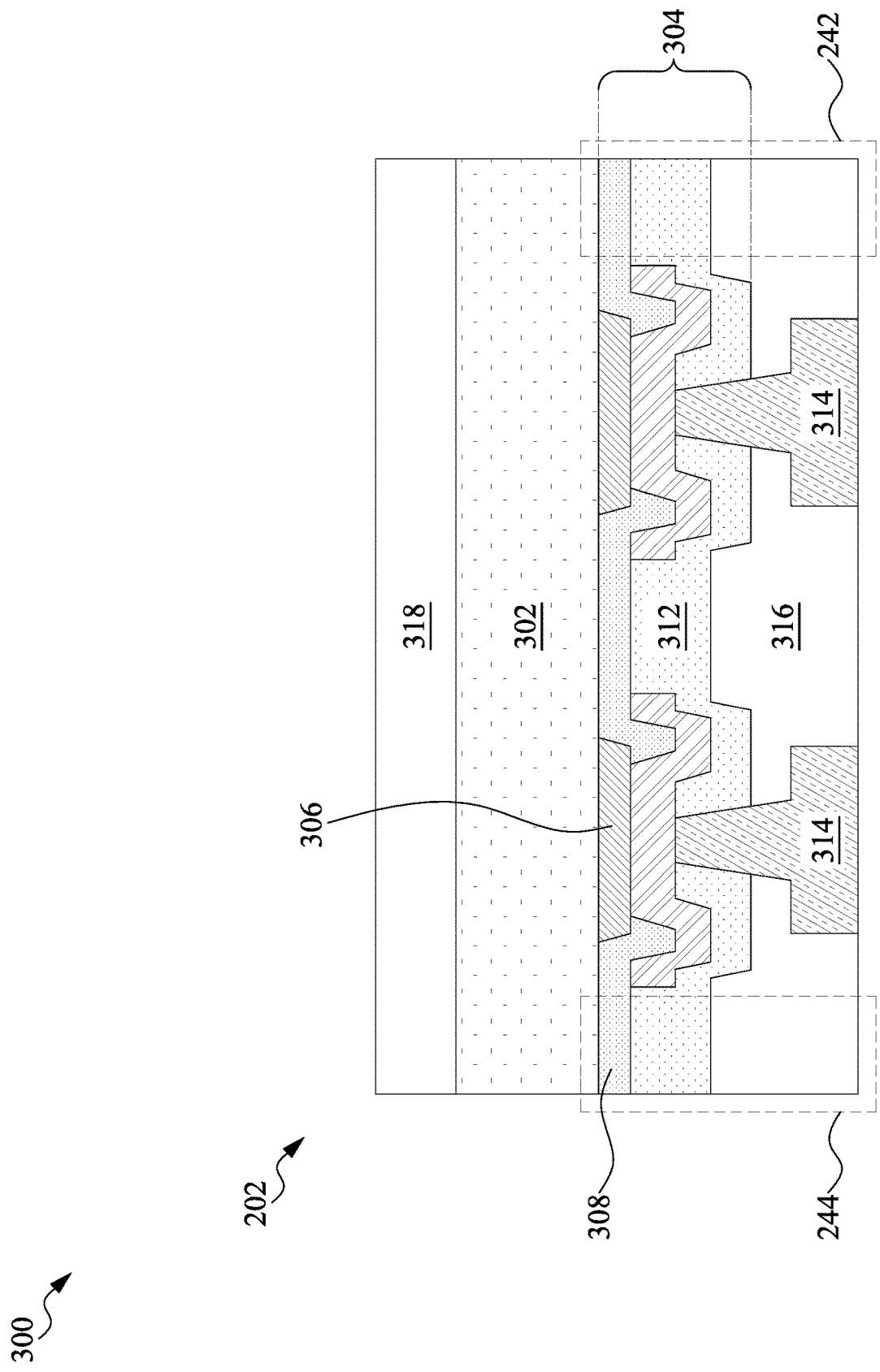
FIG. 3 is a diagram of an example implementation of a semiconductor die package described herein.

FIG. 3 is a diagram of an example implementation 300 of the semiconductor die package 202 described herein. The semiconductor die package 202 may include one or more semiconductor dies 302. The one or more semiconductor dies 302 may include a logic die, a memory die, an HBM die, an I/O die, a system-on-chip (SoC) die, a DRAM IC die, an SRAM IC die, a central processing unit (CPU) die, a graphics processing unit (GPU) die, a digital signal processing (DSP) die, an application specific integrated circuit (ASIC) die, and/or another type of semiconductor die. The semiconductor dies(s) 302 may be included in a substrate, one or more layers of silicon (Si), and/or one or more layers of another material.

As shown in FIG. 3, the semiconductor die(s) 302 may be attached to a connection structure 304. The connection structure 304 may include an RDL structure, an interconnect structure, and/or an interposer, among other examples. The semiconductor die(s) 302 may be attached to the connection structure 304 by a plurality of conductive structure 306. The conductive structures 306 may include a stud, a pillar, a bump, a solderball, a micro-bump, a contact pad (or contact land), an under-bump metallization (UBM) structure, and/or another type of conductive structure, among other examples. The conductive structures 306 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The conductive structures 306 may be surrounded by a passivation layer 308 of the connection structure 304. Metallization layers 310 may be connected with the conductive structures 306. The metallization layers 310 may include metal lines, trenches, vias, pillars, and/or another type of metallization layers. The metallization layers 310 may include one or more materials, such as a gold (Au) material, a copper (Cu) material, a silver (Ag) material, a nickel (Ni) material, a tin (Sn) material, a lead (Pb) material, or a palladium (Pd) material, among other examples.

The metallization layers 310 may be surrounded by a dielectric layer 312. The dielectric layer 312 may include polybenzoxazole (PBO), polyimide, benzocyclobutene (BCB), silicon oxide ($SiO_x$), and/or another suitable dielectric material. The connection structure 304 may include additional metallization layers 310 and/or additional dielectric layers 312 to redistribute electrical signals to and from the semiconductor die(s) 302. Connectors 314 may be electrically connected with the metallization layers 310. The connectors 314 may electrically connect the metallization layers 310 with the metallization layers 208 of the semiconductor device package substrate 206.

An insulator layer 316 may be included over the connection structure 304 such that the connection structure 304 is included between the insulator layer 316 and the semiconductor die(s) 302. The insulator layer 316 may be included to fill gaps between the connectors 314 and the semiconductor device package substrate 206. The insulator layer 316 may include polybenzoxazole (PBO), polyimide, benzocyclobutene (BCB), silicon oxide ($SiO_x$), and/or another suitable dielectric material. A die attach film (DAF) 318 may be included on a side of the semiconductor die(s) 302 opposing the side to which the connection structure 304 is attached. The DAF 318 may be included to enable the semiconductor die package 202 to be mounted to, and subsequently removed from, a carrier substrate and/or a frame for processing. The DAF 318 may include an epoxy resin, a phenol resin, an acrylic rubber, a silica filler, and/or another suitable material.

FIG. 3 further illustrates the locations of the end portions 242 and 244. The end portions 242 and 244 of the semiconductor die package 202 may include a stress relief trench between an outer edge of the semiconductor die package 202 and a seal ring structure of the semiconductor die package 202. The stress relief trench extends into and/or through one or more layers of the semiconductor die package 202 in the end portions 242 and 244, such as insulator layer, a connection structure, and/or into a portion of a semiconductor die of the semiconductor die package 202. Delamination may occur in one or more layers of the scribe line regions in the end portions 242 and/or 244 due to stress that is exerted on the end portions 242 and/or 244. The stress may result, for example, due to expansion and/or swelling of the encapsulation layer 212 if the molding compound of the encapsulation layer 212 is exposed to high heat and/or high humidity. The stress relief trench is configured to reduce a likelihood of delamination in the end portions 242 and 244 from propagating from a scribe line region of the semiconductor die package 202 and into an active region of the semiconductor die package 202 through the seal ring region. This may prevent or reduce the likelihood of a delamination in the end portions 242 and 244 causing device failures in the semiconductor die package 202.

As indicated above, FIG. 3 is provided as an example. Other examples may differ from what is described with regard to FIG. 3.

Figure 4A:
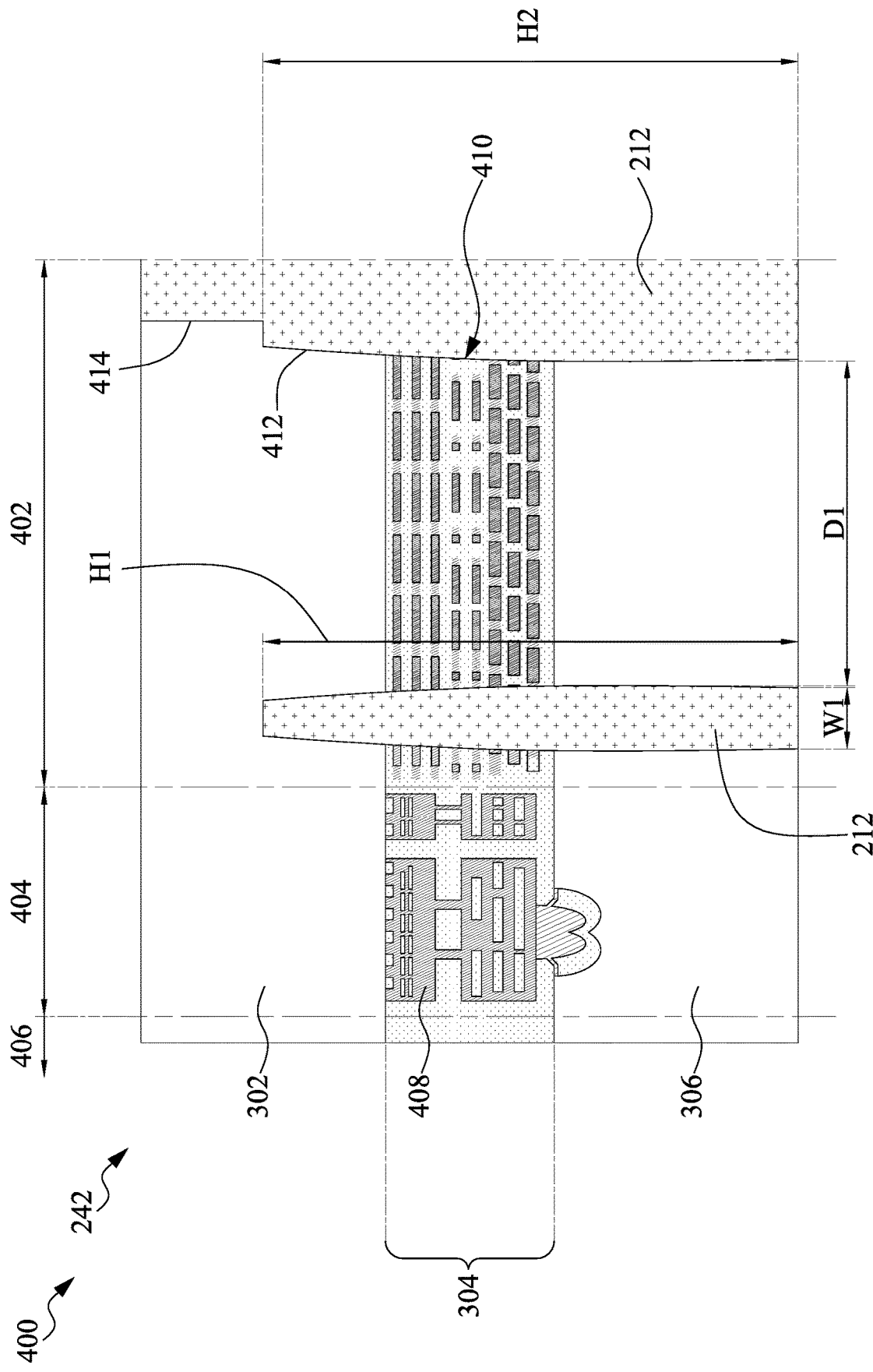
FIGS. 4A-4C are diagrams of an example implementation of a semiconductor die package described herein.
Figure 4B:
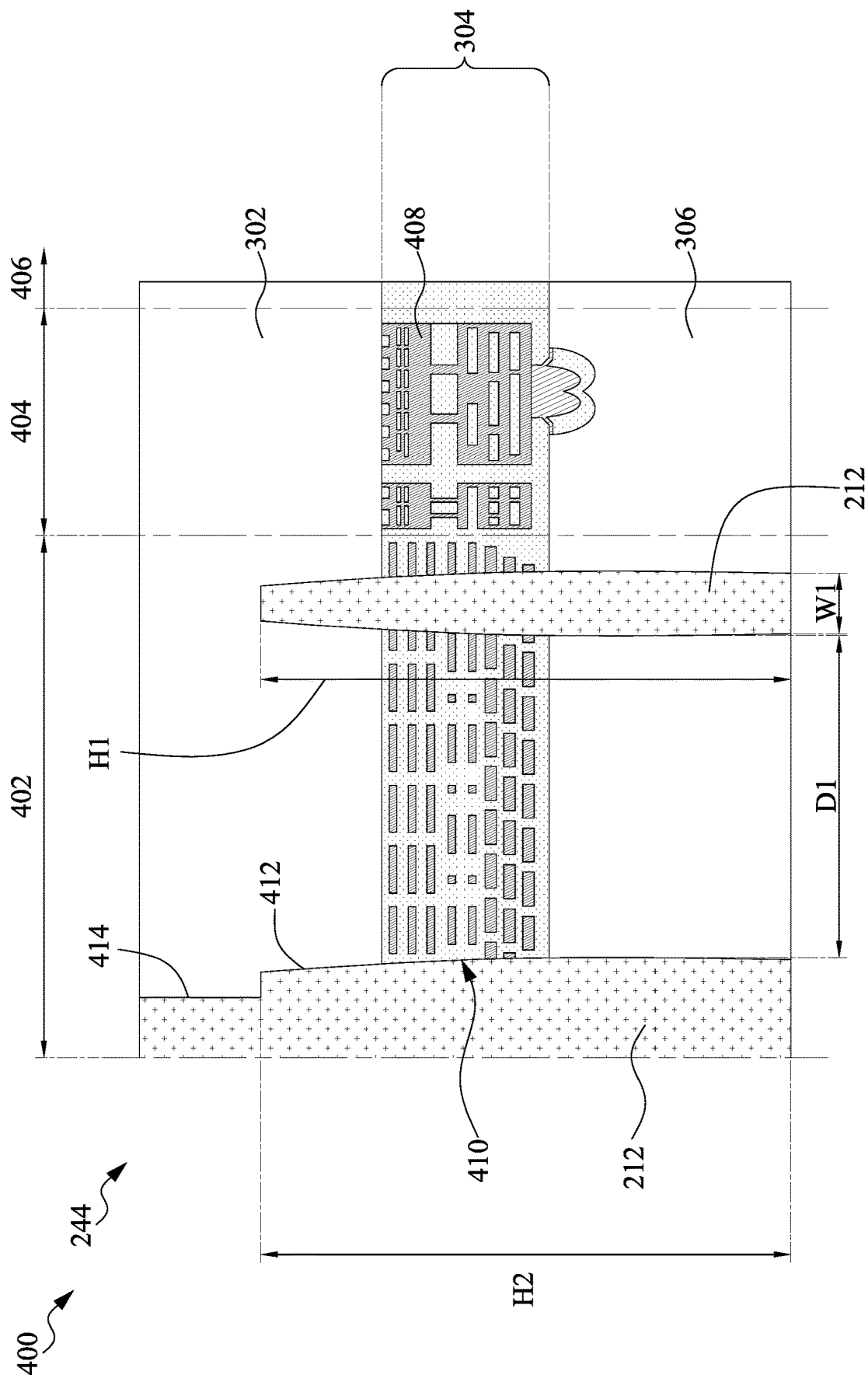
Figure 4C:
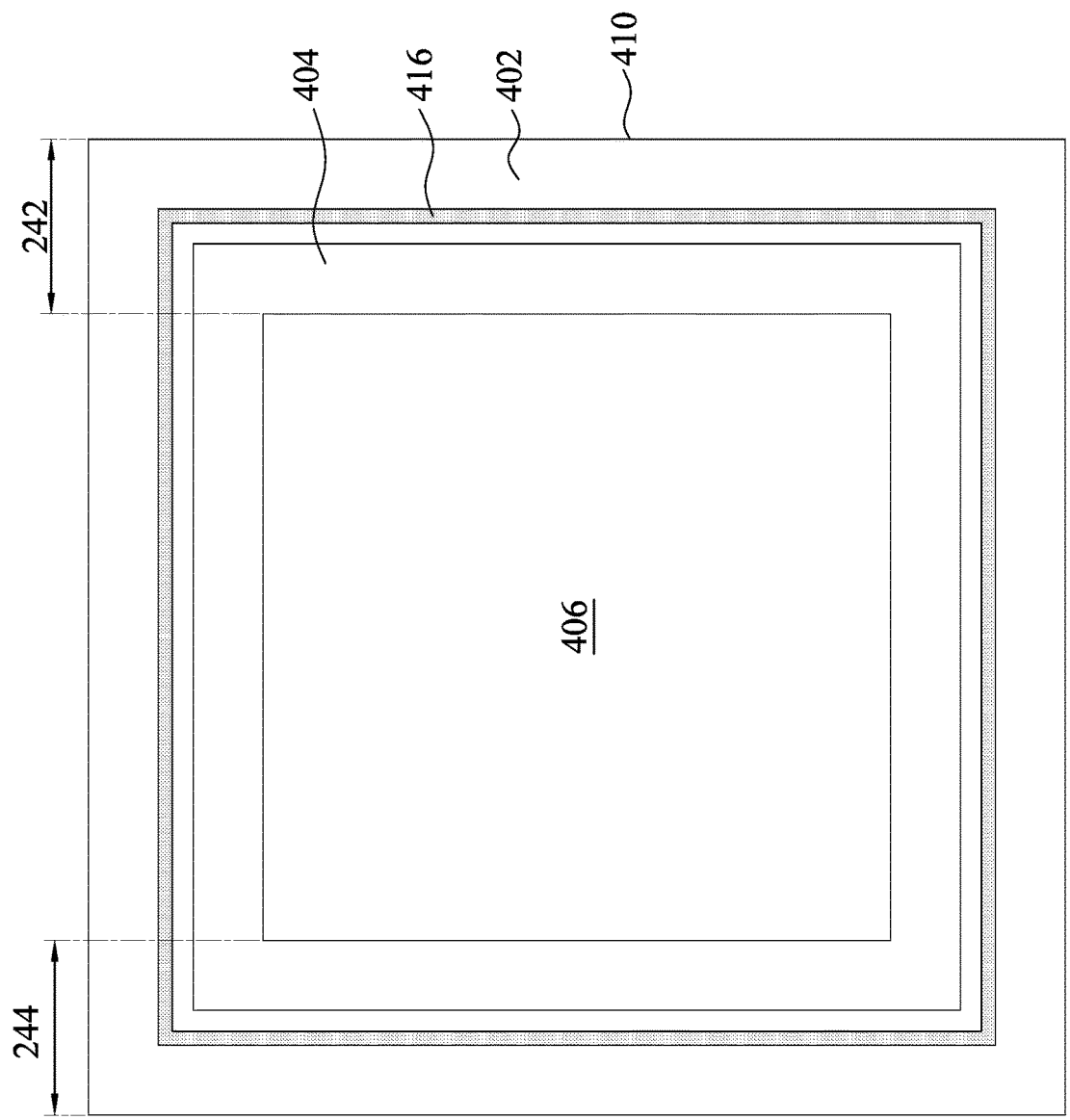

FIGS. 4A-4C are diagrams of an example implementation 400 of the semiconductor die package 200 described herein. The example implementation 400 includes an example of the end portions 242 and 244 of the semiconductor die package 202 including a stress relief trench to reduce a likelihood of delamination in the end portions 242 and 244 from propagating from a scribe line region of the semiconductor die package 202 and into an active region of the semiconductor die package 202 through the seal ring region.

FIG. 4A illustrates a cross-section view of the end portion 242. As shown in FIG. 4A, the end portion 242 of the semiconductor die package 202 includes a scribe line region 402 and a seal ring region 404 next to or adjacent to the scribe line region 402. The seal ring region 404 is next to or adjacent to an active region 406 of the semiconductor die package 202. The active region 406 extends toward a center of the semiconductor die package 202.

The scribe line region 402 includes a region of the semiconductor die package 202 that is used to saw or dice a wafer into individual pieces including the semiconductor die package 202. The scribe line region 402 may be referred to as a non-active region of the semiconductor die package 202 in that the metallization layers and/or other conductive structures included in the scribe line region 402 are not used in the active electrical operation (e.g., in processing, memory, storage) of the semiconductor die package 202. The metallization layers and/or other conductive structures included in the scribe line region 402 may provide structural rigidity to the end portion 242, which may reduce the likelihood of vibration in a singulation (e.g., die sawing or die cutting) operation that is performed to saw or dice a wafer into individual pieces including the semiconductor die package 202.

The seal ring region 404 may include one or more seal ring structures 408 (e.g., in the connection structure 304) that are included to seal around the active region 406 of the semiconductor die package 202. The seal ring structure(s) 408 include a plurality of horizontally and/or vertically arranged metallization layers that are configured to reduce and/or prevent ingress of humidity, oxygen, particles, and/or another type of contaminants into the active region 406. Moreover, the seal ring structure(s) 408 may be included to reduce cracking and/or delamination in the active region 406. The active region 406 includes the active integrated circuitry of the semiconductor die package 202. The active integrated circuitry may perform the primary electrical and processing functions of the semiconductor die package 202. The active circuitry may include transistors, pixel sensors, power circuitry, and/or other active circuitry.

The seal ring region 404 may be included between the scribe line region 402 and the active region 406. The seal ring region 404 may be included on side of the scribe line region 402 opposing an outer edge 410 of the semiconductor die package 202. The outer edge 410 of the semiconductor die package 202 may include a curved portion 412 and an approximately straight portion 414 connected to the curved portion 412. The curved portion 412 may extend through the insulator layer 316, through the connection structure 304, and into a portion of the semiconductor die(s) 302. The approximately straight portion 414 may be included above the curved portion 412 and may extend through the semiconductor die(s) 302. The outer edge 410 of the semiconductor die package 202 may be surrounded by the molding compound of the encapsulation layer 212 of the semiconductor device package 200.

As further shown in FIG. 4A, a stress relief trench 416 may be included between the outer edge 410 of the semiconductor die package 202 and the seal ring structure 408 in the seal ring region 404 of the semiconductor die package 202. The stress relief trench 416 may include an elongated structure that extends into a top surface of the insulator layer 316 and through the insulator layer 316, through the connection structure 304, and into a portion of the semiconductor die(s) 302. The stress relief trench 416 may be included in the scribe line region 402 and next to or adjacent to the seal ring structure 408. The stress relief trench 416 includes a groove or recess that is filled with the molding compound of the encapsulation layer 212.

The stress relief trench 416 is configured to reduce a likelihood of delamination propagating from a scribe line region 402 of the semiconductor die package into the active region 406 through the seal ring region 404. The stress relief trench 416 is spaced away from the outer edge 410 of the semiconductor die package 202 by a distance D1, which may be included in a range of approximately 110 microns to approximately 120 microns. However, other values for the range are within the scope of the present disclosure. In some cases, the molding compound of the encapsulation layer 212 may swell and/or expand (e.g., when the encapsulation layer 212 experiences high humidity levels and/or high temperatures). The expansion of the molding compound of the encapsulation layer 212 may exert a stress (e.g., a lateral stress, a vertical stress) onto the outer edge 410 of the semiconductor die package 202. In some cases, the stress on the outer edge 410 of the semiconductor die package 202 may cause one or more portions of the semiconductor die package 202 to delaminate or crack in the scribe line region 402. A crack may start at the outer edge 410 and may propagate through the scribe line region 402 toward the stress relief trench 416. The stress relief trench 416 stops the crack from propagating further and contains the delamination caused by the cracking to the scribe line region 402. In this way, the stress relief trench 416 is configured to prevent delamination and/or cracking from propagating into the seal ring region 404 and causing delamination and/or cracking through the seal ring structure 408 and into the active region 406 of the semiconductor die package 202.

The stress relief trench 416 may resist the propagation of delamination and/or cracking into the active region 406 in that the stress relief trench 416 is formed to a narrow width W1. The narrow width W1 of the stress relief trench 416 limits the amount of molding compound of the encapsulation layer 212 that can be filled in the groove or recess of the stress relief trench 416, which limits the amount of molding compound expansion in the groove or recess of the stress relief trench 416. This limits the amount of stress that can be transferred in the stress relief trench 416 from the molding compound of the encapsulation layer 212 to the semiconductor die package 202, which reduces the likelihood of delamination and/or cracking propagating from the scribe line region 402 of the semiconductor die package into the active region 406 through the seal ring region 404.

In some implementations, the width W1 of the stress relief trench 416 is included in a range of approximately 5 microns to approximately 20 microns to limit the transfer of stress from the molding compound in the groove or recess of the stress relief trench 416 to the semiconductor die package 202 while enabling the groove or recess to be cut through the connection structure 304 and enabling the molding compound to be filled in the groove or recess. However, other values for the range are within the scope of the present disclosure.

The stress relief trench 416 may be formed to a sufficient height H1 to enable the stress relief trench 416 to be formed fully through the connection structure 304 and into a portion of the semiconductor die(s) 302. In some implementations, the height H1 of the stress relief trench 416 is included in a range of approximately 15 microns to approximately 60 microns. If the height H1 of the stress relief trench 416 is too small, the delamination and/or cracking might still be able to propagate around the stress relief trench 416 and into the active region 406. If the height H1 of the stress relief trench is too large, the groove or recess of the stress relief trench 416 might be filled with too much molding compound, which may cause delamination and/or cracking might to initiate in the groove or recess of the stress relief trench 416. However, other values for the range are within the scope of the present disclosure.

In some implementations, the height H1 of the stress relief trench 416 and a height H2 of the curved portion of the outer edge 410 of the semiconductor die package 202 are approximately a same height. In some implementations, the height H1 of the stress relief trench 416 and the height H2 of the curved portion of the outer edge 410 of the semiconductor die package 202 are different heights. In some implementations, the stress relief trench 416 may include an aspect ratio between the height H1 and the width W1 that is greater than or approximately equal to 3:1.

FIG. 4B illustrates a cross-section view of the end portion 244, which is an end portion of the semiconductor die package 202 on an opposing die of the semiconductor die package 202 relative to the end portion 242. As shown in FIG. 4B, the end portion 242 is substantially a mirrored configuration of the end portion 242, and includes the stress relief trench 416 in the scribe line region 402 of the semiconductor die package 202.

FIG. 4C illustrates a top-down view of the semiconductor die package 202, showing the stress relief trench 416. As shown in the top-down view in FIG. 4C, the active region 406 of the semiconductor die package 202 may occupy a central area of the semiconductor die package 202. The seal ring region 404 may encircle the active region 406, and the scribe line region 402 may encircle the active region 406 and the seal ring region 404 around the perimeter of the semiconductor die package 202.

In the top-down view of the semiconductor die package 202, the stress relief trench 416 is included around a perimeter of the semiconductor die package 202. Further, in the top-down view of the semiconductor die package 202, the stress relief trench 416 may be included in the scribe line region 402. Moreover, in the top-down view of the semiconductor die package 202, the stress relief trench 416 may surround and/or encircle the seal ring region 404 and the active region 406 of the semiconductor die package 202.

As indicated above, FIGS. 4A-4C are provided as an example. Other examples may differ from what is described with regard to FIGS. 4A-4C.

FIGS. 5A-5I are diagrams of an example implementation 500 described herein. The example implementation 500 may include an example of forming a plurality of semiconductor die packages 202, including a semiconductor die package 202a and a semiconductor die package 202b, on a wafer 502. The semiconductor die package 202a may be adjacent to, next, and/or side-by-side with the semiconductor die package 202b on the wafer 502.

As shown in FIG. 5A, semiconductor die(s) 302 may be formed for the semiconductor die package 202a and for the semiconductor die package 202b. In some implementations, the semiconductor die(s) 302 may be formed in and/or on the wafer 502. One or more front end of line (FEOL) semiconductor processing tools, one or more middle end of line (MEOL) semiconductor processing tools, and/or one or more back end of line (BEOL) semiconductor processing tools may form the semiconductor die(s) 302 for the semiconductor die package 202a and for the semiconductor die package 202b. These tools may include photolithography tools (e.g., an exposure tool, a developer tool, and etch tool), deposition tools, plating tools, bonding tools, and/or another type of semiconductor processing tools.

Figure 5B:
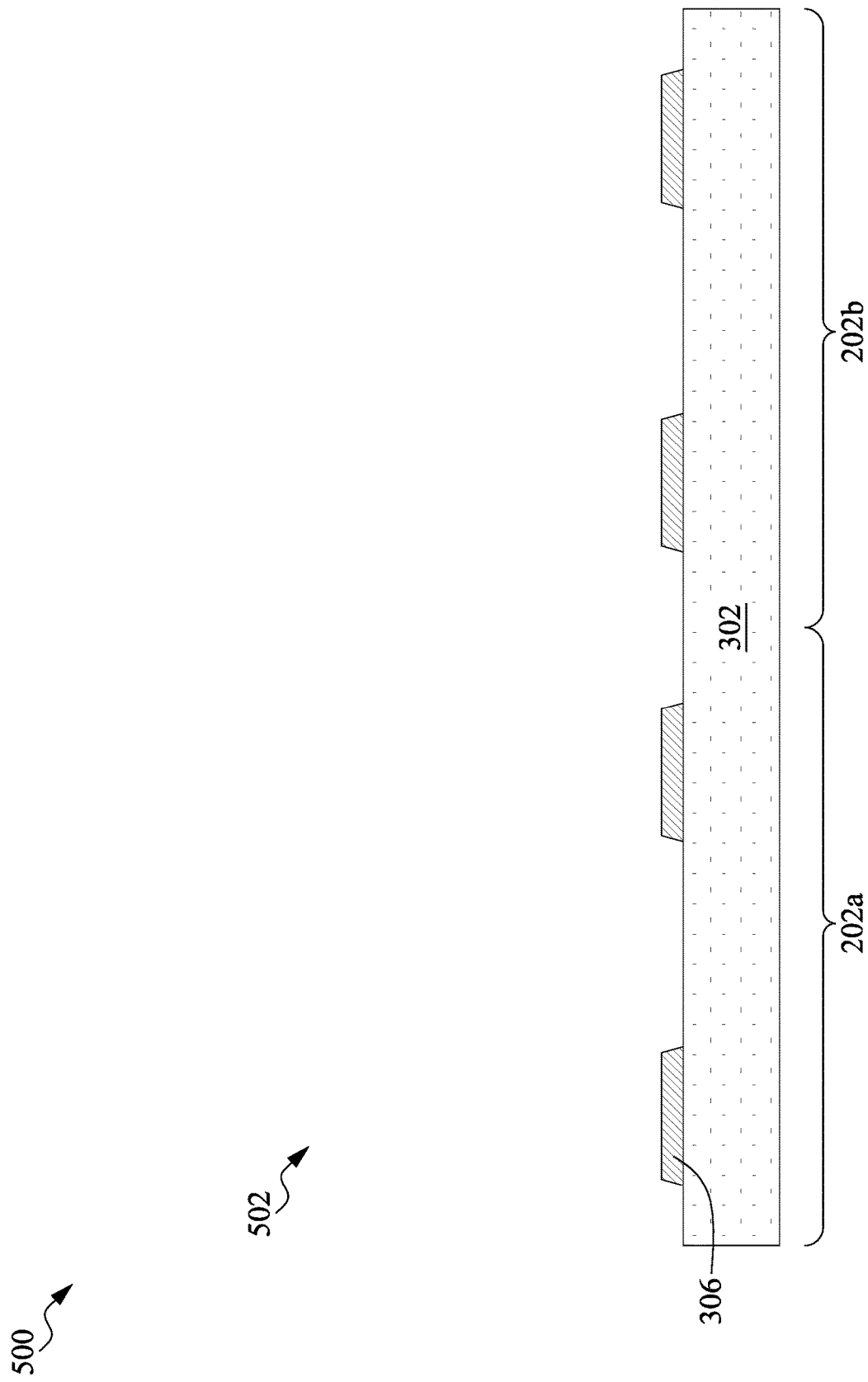

As shown in FIG. 5B, conductive structures 306 may be formed over and/or on the semiconductor die(s) 302. In particular, the connection tool set 115 may form the conductive structures 306 over and/or on the semiconductor die(s) 302.

Forming the conductive structures 306 may include a plurality of processing operations. A seed layer may be formed over and/or on the semiconductor die(s) 302. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The patterning may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the conductive structures 306.

Figure 5C:
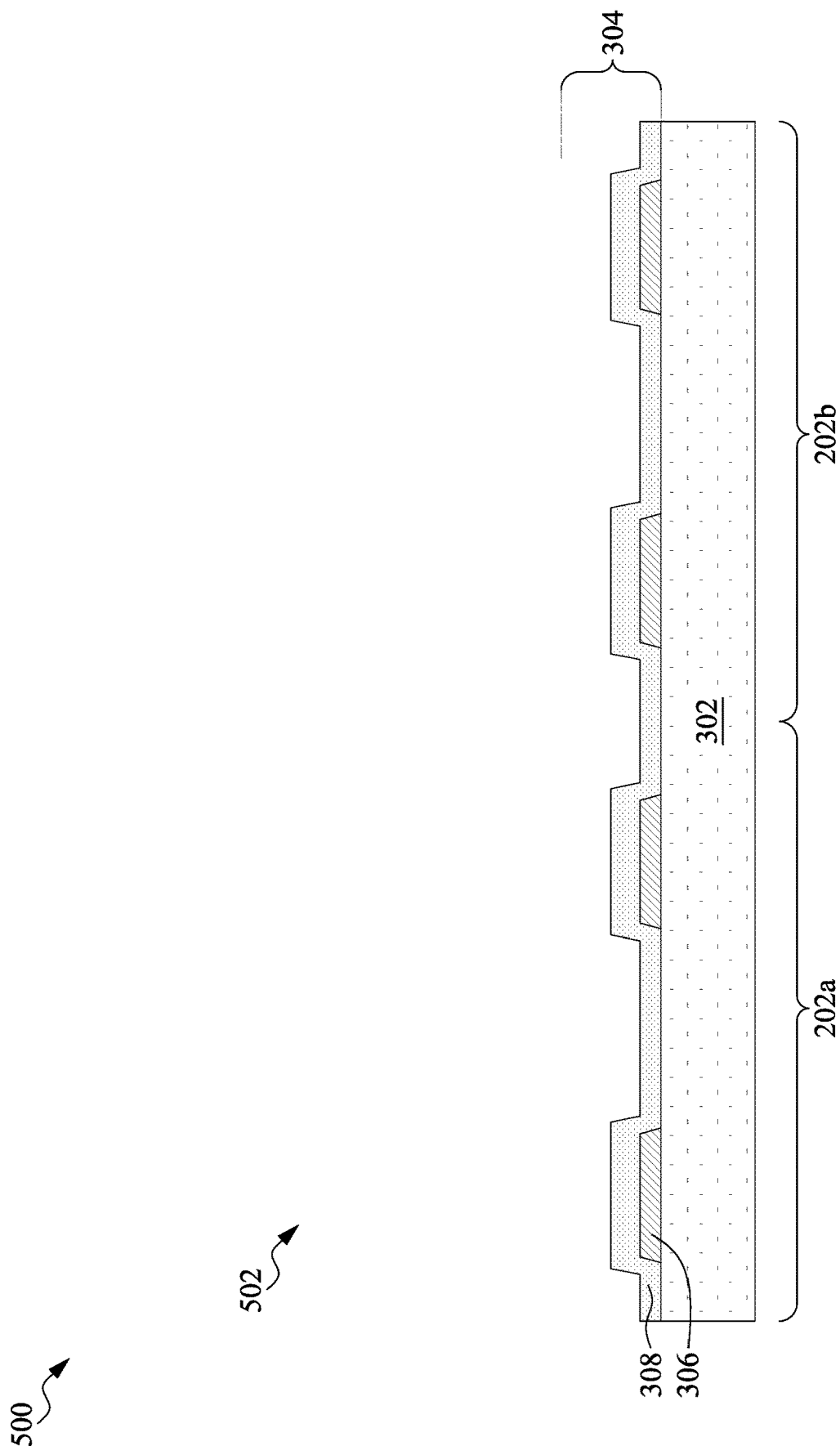

As shown in FIG. 5C, a passivation layer 308 may be formed over and/or on the semiconductor die(s) 302 and over and/or on the conductive structures 306. The RDL tool set 105 may form the passivation layer 308 using a deposition technique, such as a CVD technique, a PVD technique, and/or an ALD technique, among other examples.

Figure 5D:
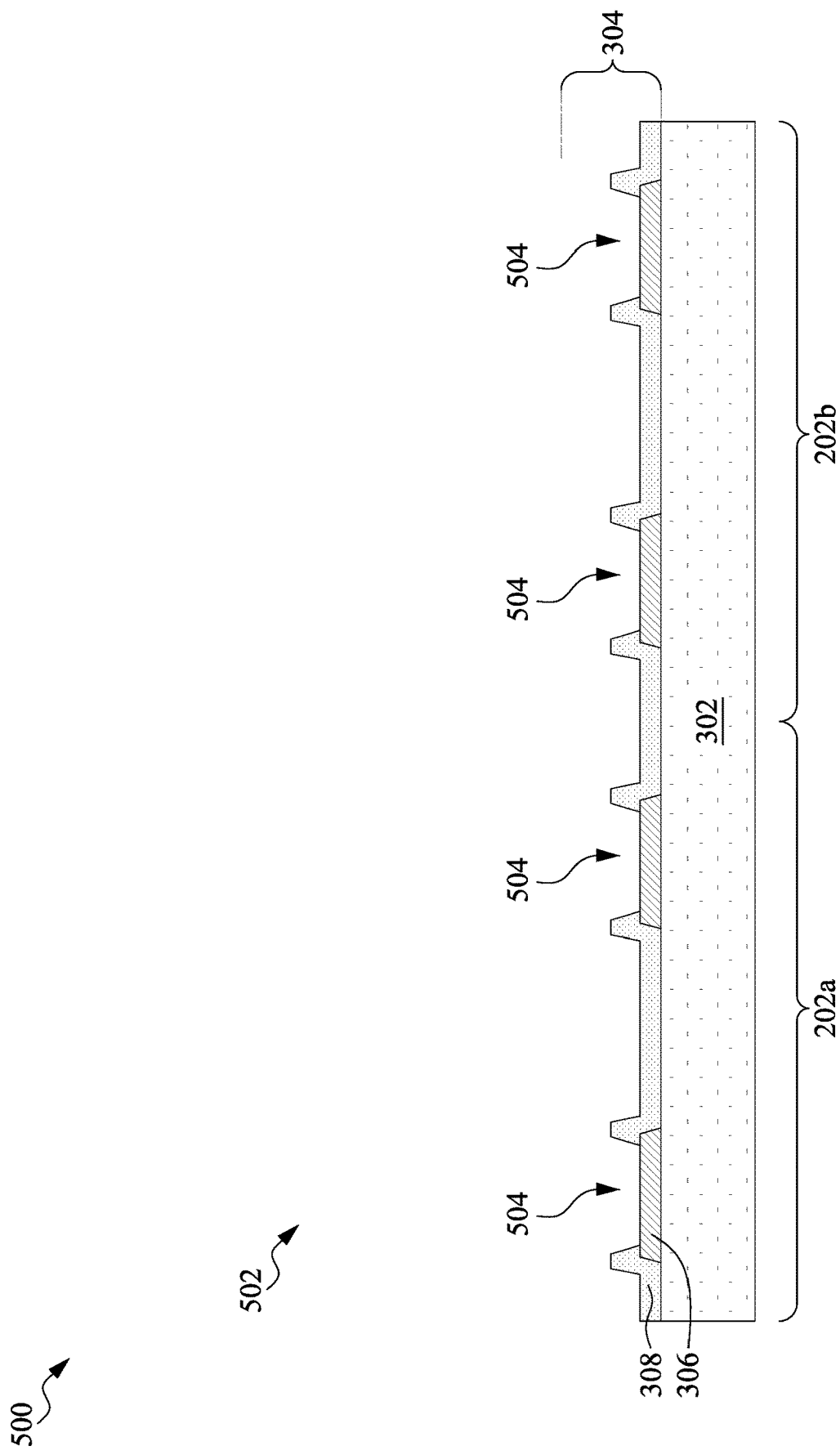

As shown in FIG. 5D, openings 504 may be formed through the passivation layer 308 to expose top surfaces of the conductive structures 306. The RDL tool set 105 may form a photoresist on the passivation layer, may form a pattern in the photoresist, and may etch through the passivation layer 308 using the pattern in the photoresist.

Figure 5E:
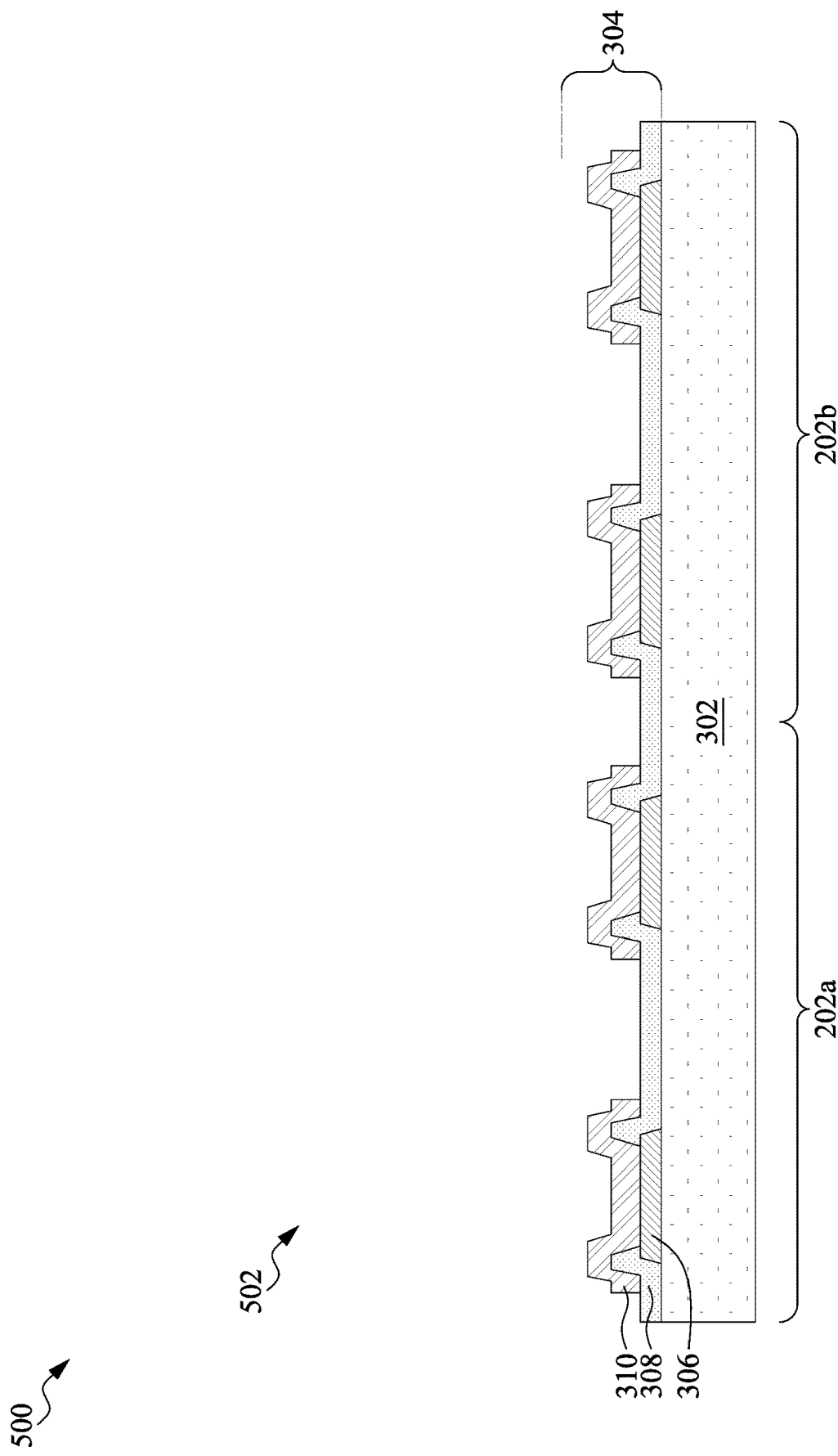

As shown in FIG. 5E, metallization layers 310 of the connection structure 304 may be formed on top of the conductive structures 306. The RDL tool set 105 may form a seed layer over and/or on the conductive structures 306. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique. The RDL tool set 105 may then deposit a conductive material onto the seed layer. The conductive material may be formed by plating, such as electroplating or electroless plating, PVD, CVD, and/or another suitable deposition technique. The combination of the conductive material and underlying portions of the seed layer may correspond to the metallization layers 310.

Figure 5F:
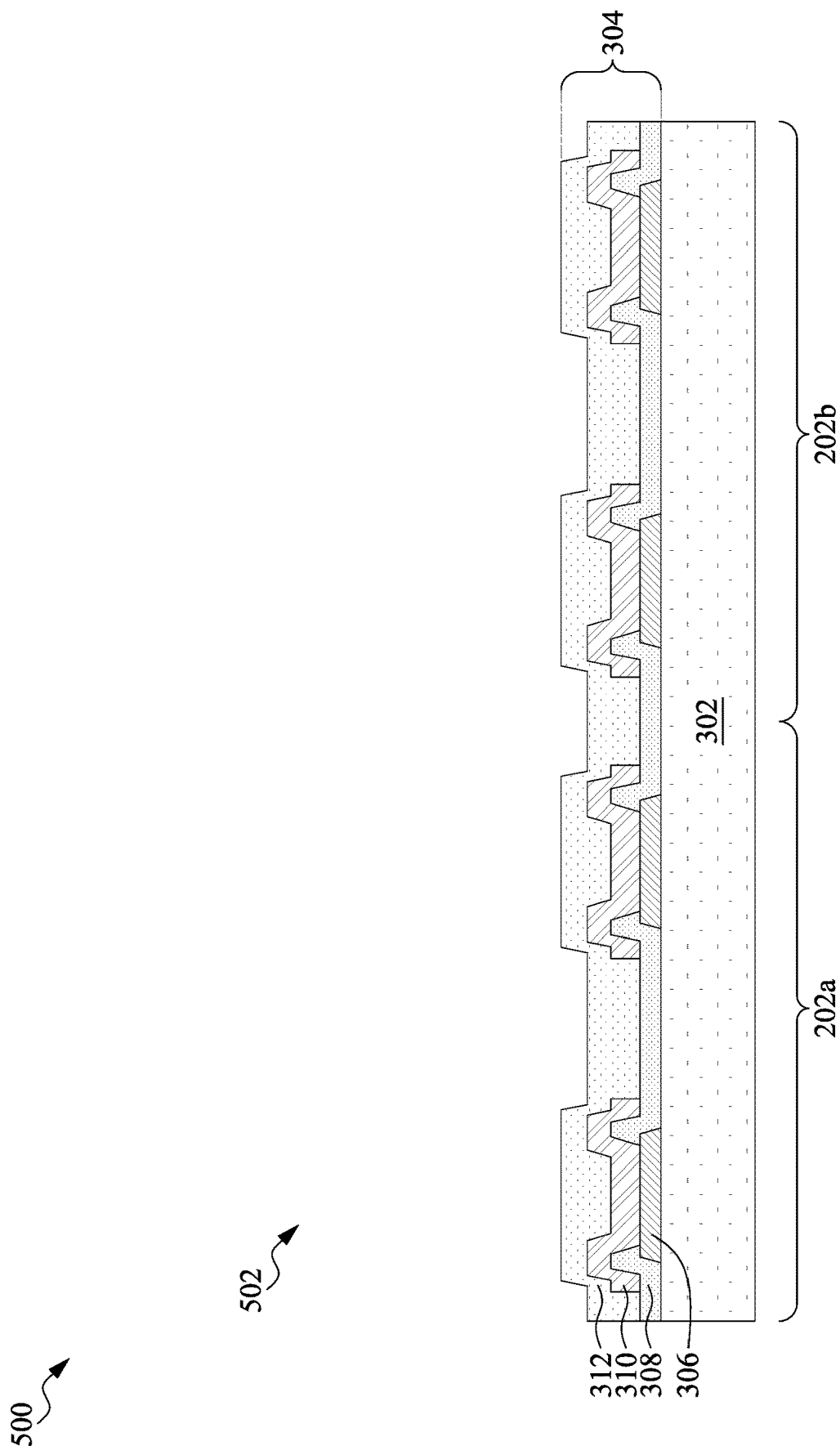

As shown in FIG. 5F, dielectric layers 312 of the connection structure 304 may be formed around the metallization layers 310. In some implementations, the RDL tool set 105 forms a plurality of alternating layers of metallization layers 310 and dielectric layers 312 to form the connection structure 304. The RDL tool set 105 may deposit the dielectric layers 312 using a deposition technique, such as a CVD technique, a PVD technique, and/or an ALD technique, among other examples.

Figure 5G:
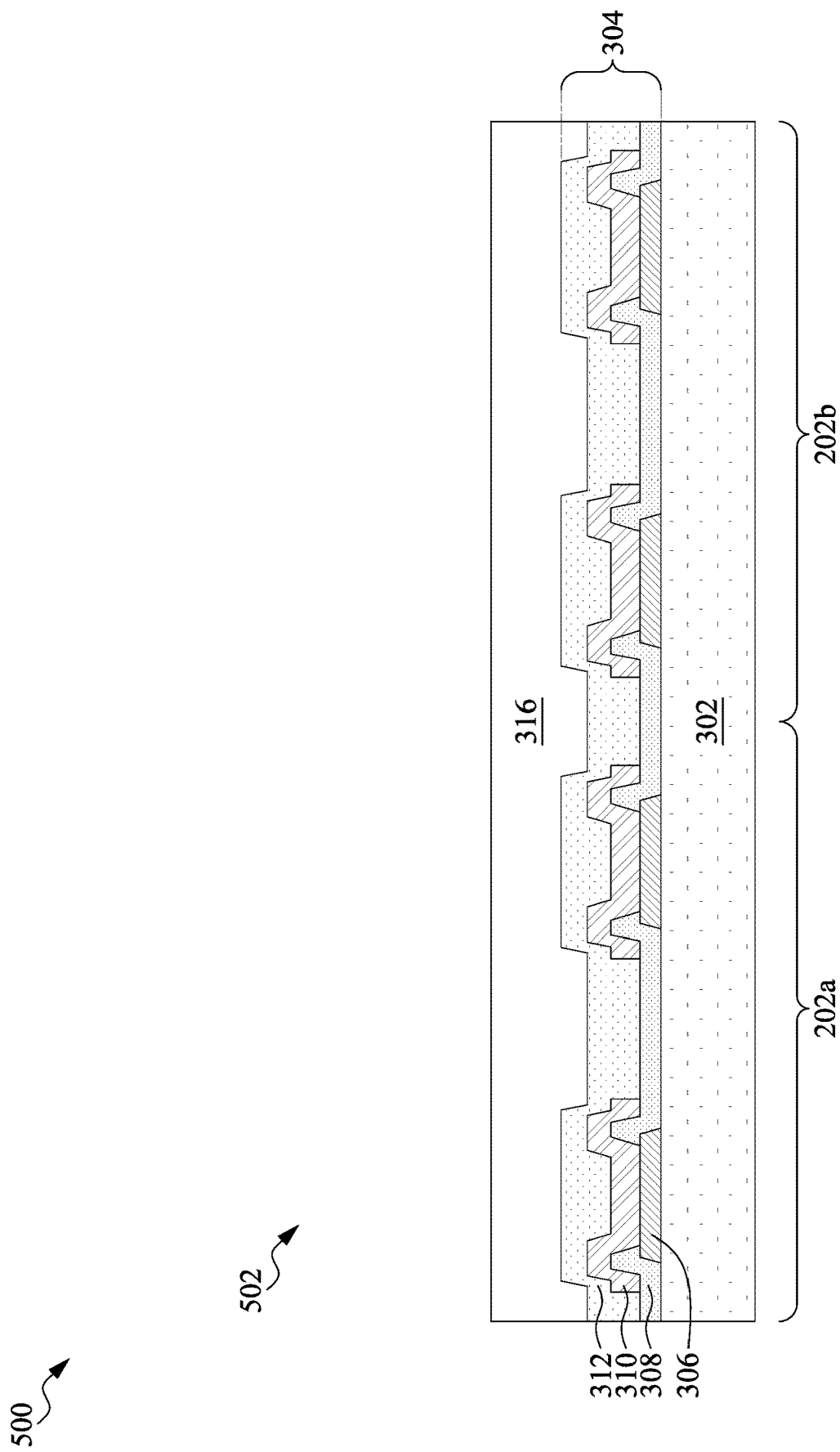

As shown in FIG. 5G, an insulator layer 316 may be formed over and/or on the connection structure 304 (e.g., over and/or on the topmost dielectric layer 312). The RDL tool set 105 may deposit the insulator layer 316 using a deposition technique, such as a CVD technique, a PVD technique, an ALD technique, and/or a spin-coating technique, among other examples.

Figure 5H:
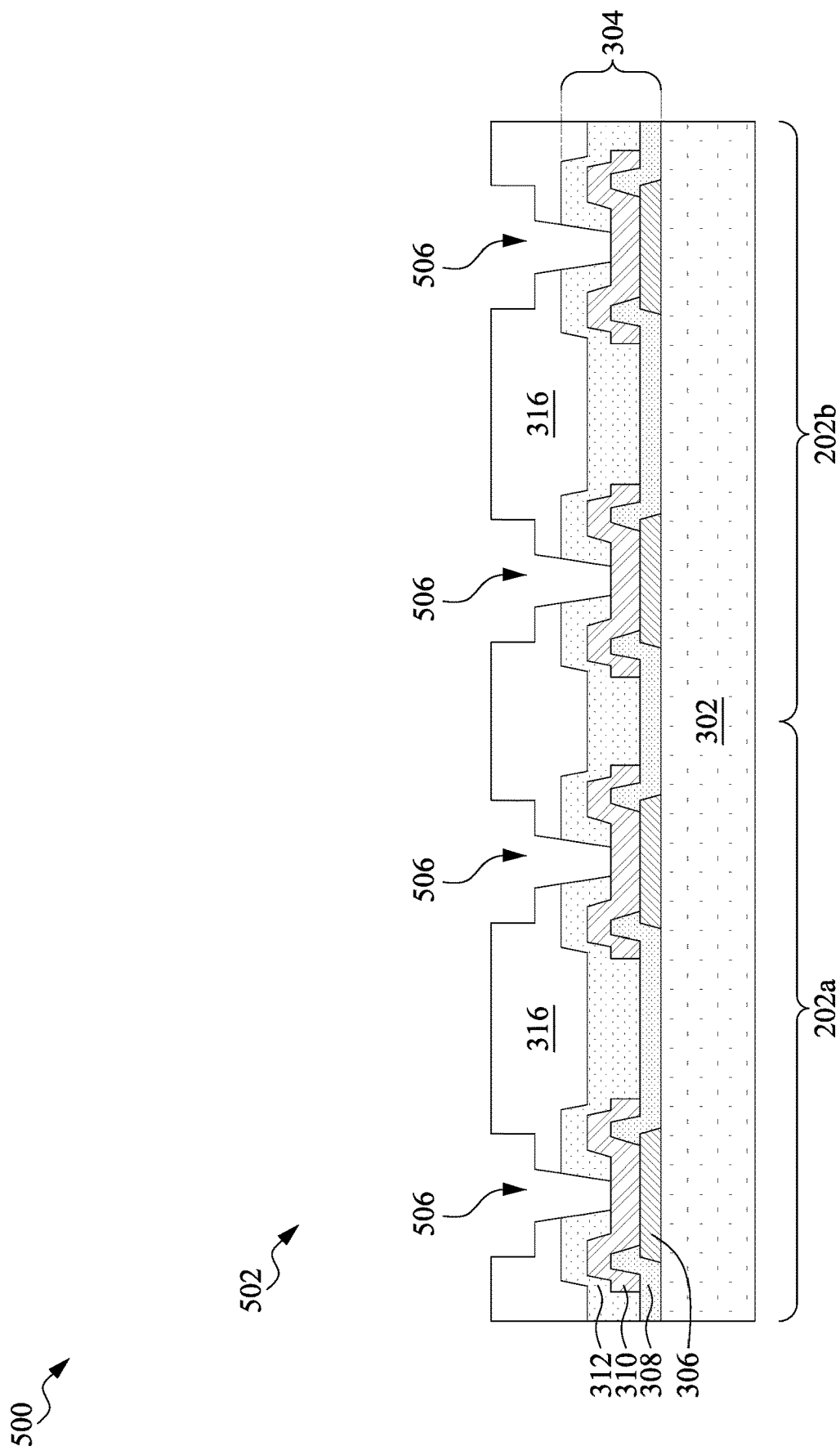

As shown in FIG. 5H, openings 506 may be formed in and/or through the insulator layer 316 and one or more of the dielectric layers 312 to a metallization layer 310. The top surfaces of the metallization layer 310 may be exposed through the openings 506. In some implementations, a pattern in a photoresist layer is used to etch the insulator layer 316 and the one or more of the dielectric layers 312 to form the openings 506. In these implementations, the RDL tool set 105 forms the photoresist layer on the insulator layer 316, exposes the photoresist layer to a radiation source to pattern the photoresist layer, develops and removes portions of the photoresist layer to expose the pattern, and etches the insulator layer 316 based on the pattern to form the openings 506 in the insulator layer 316 and the one or more of the dielectric layers 312. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

Figure 5I:
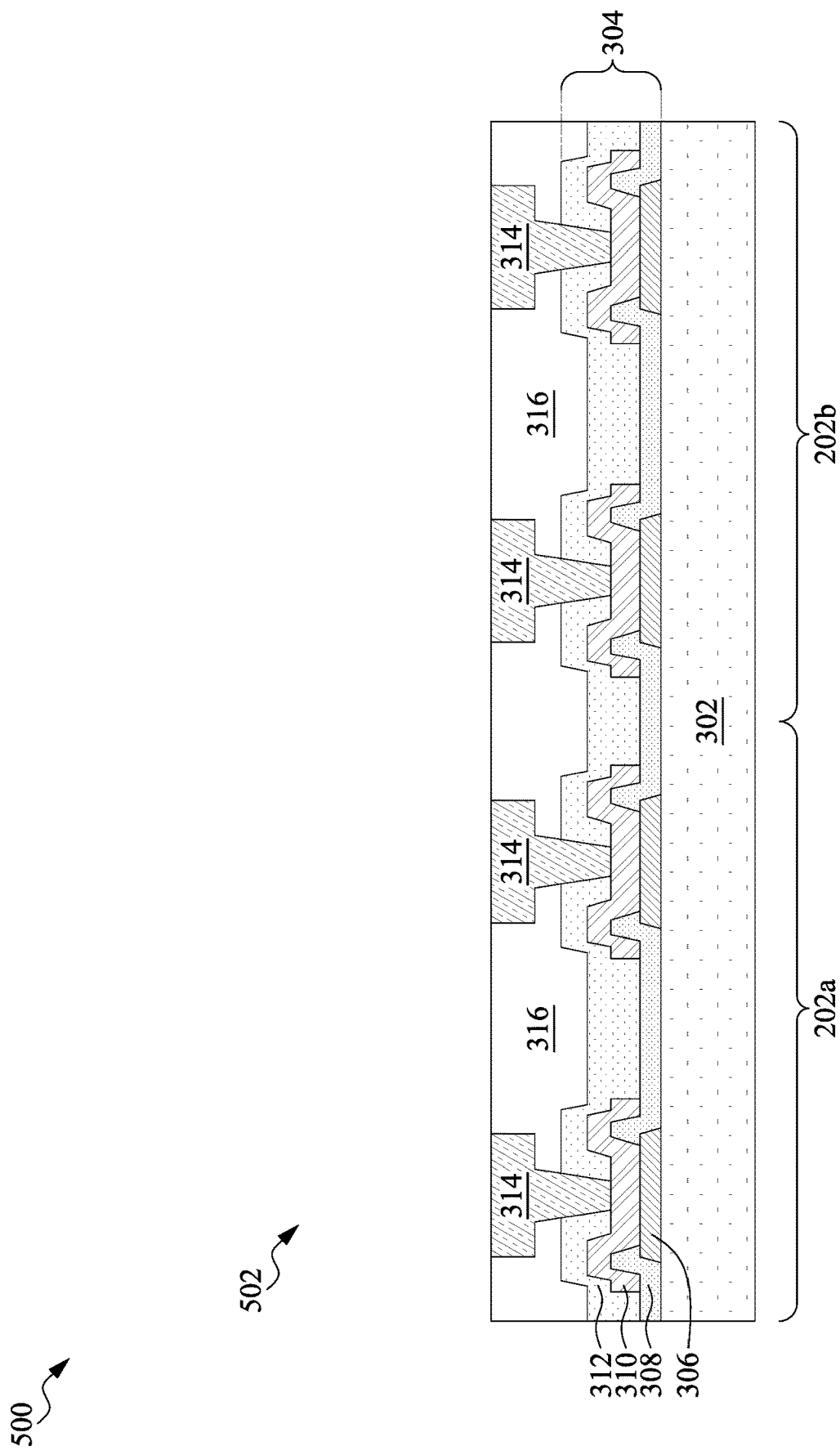

As shown in FIG. 5I, connectors 314 are formed in the openings 506 and over the top surface of the metallization layer 310. In some implementations, the silicon layer of the semiconductor die(s) 302 may be thinned in a wafer thinning process after the connectors 314 are formed, which may include a grinding operation, a planarization operation, and/or another suitable operation.

The connection tool set 115 may form the connectors 314. Forming the connectors 314 may include a plurality of processing operations. A seed layer may be formed over and/or on the metallization layer 310. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The patterning may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the connectors 314.

As indicated above, FIGS. 5A-5I are provided as an example. Other examples may differ from what is described with regard to FIGS. 5A-5I.

FIGS. 6A-6G are diagrams of an example implementation 600 described herein. The example implementation 600 includes an example of cutting or dicing the wafer 502 into individual semiconductor die packages 202, including the semiconductor die package 202a and the semiconductor die package 202b. Moreover, the example implementation 600 includes an example of forming grooves (or recesses) in the semiconductor die package 202a and in the semiconductor die package 202b. The grooves are subsequently filled with molding compound after the semiconductor die package 202a and the semiconductor die package 202b are attached to a semiconductor device package 200, which results in the formation of stress relief trenches 416 in the semiconductor die package 202a and the semiconductor die package 202b. In some implementations, the operations described in connection with FIGS. 6A-6G may be performed after one or more operations described in connection with FIGS. 5A-5I.

Figure 6A:
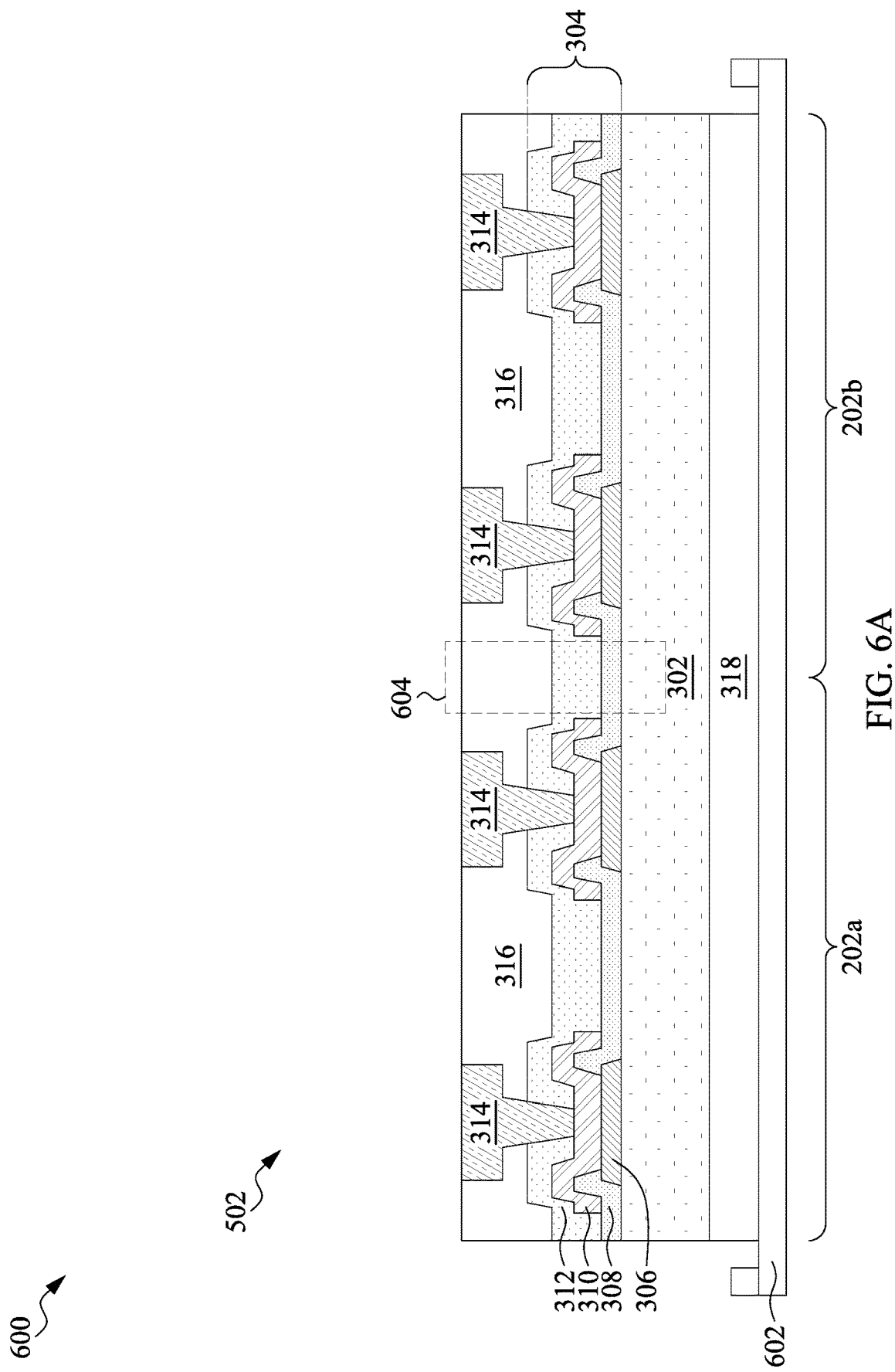
FIGS. 6A-6G are diagrams of an example implementation described herein.

As shown in FIG. 6A, the wafer 502 may be placed on a frame 602. The frame 602 may be referred to as a tape frame or another type of frame that supports the wafer 502 during a singulation operation to dice or saw the wafer 502 into individual semiconductor die packages 202. In some implementations, the ATE tool set 120 may perform wafer testing on the semiconductor die packages 202 of the wafer 502 prior to the singulation operation. In some implementations, a carrier substrate may be removed from the wafer 502 after the wafer 502 is attached to the frame 602.

Figure 6B:
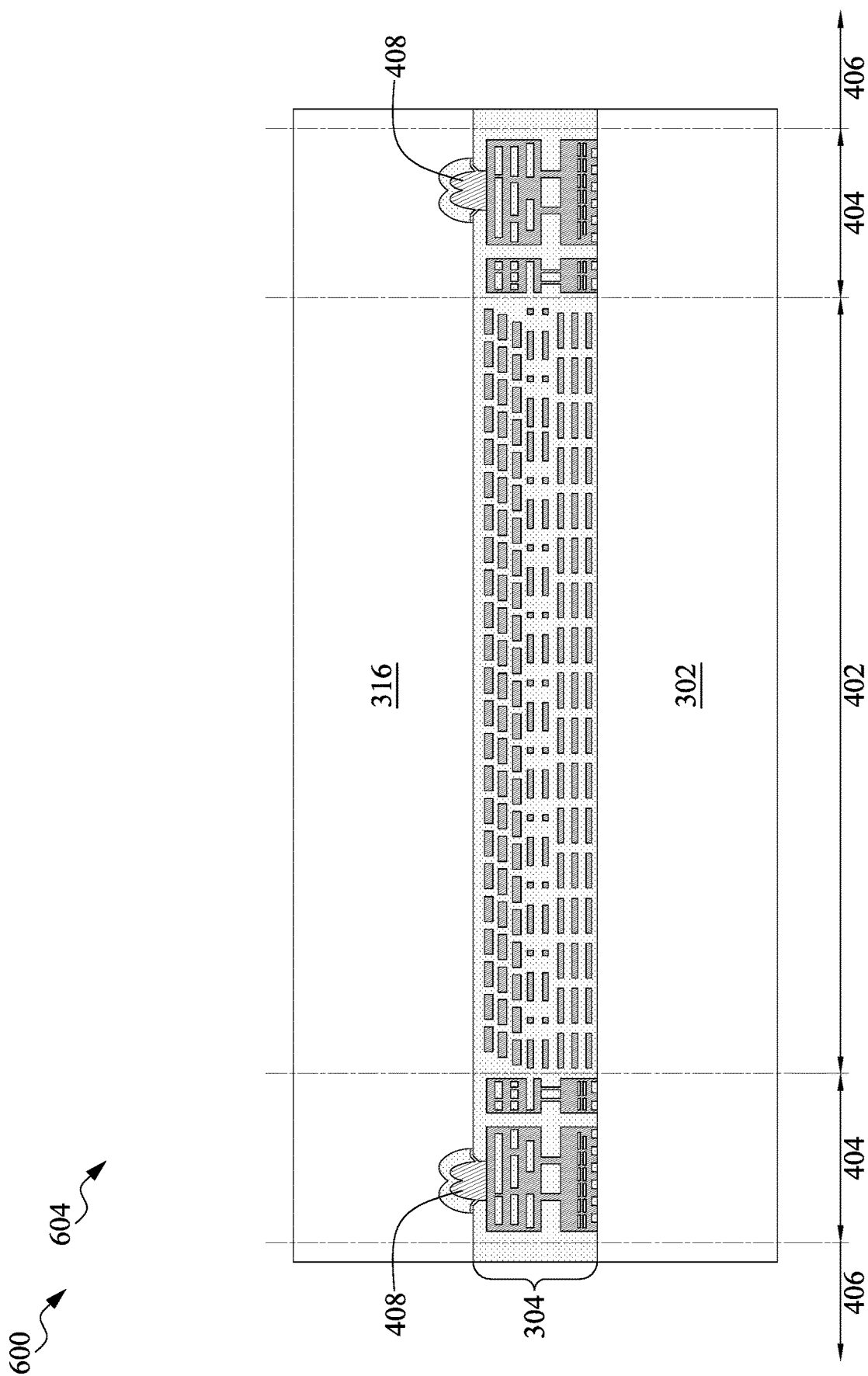

FIG. 6B illustrates a detailed view of a die cutting region 604 indicated in FIG. 6A. As shown in FIG. 6B, the die cutting region 604 may correspond to a scribe line region 402 between the semiconductor die package 202a and the semiconductor die package 202b.

Figure 6C:
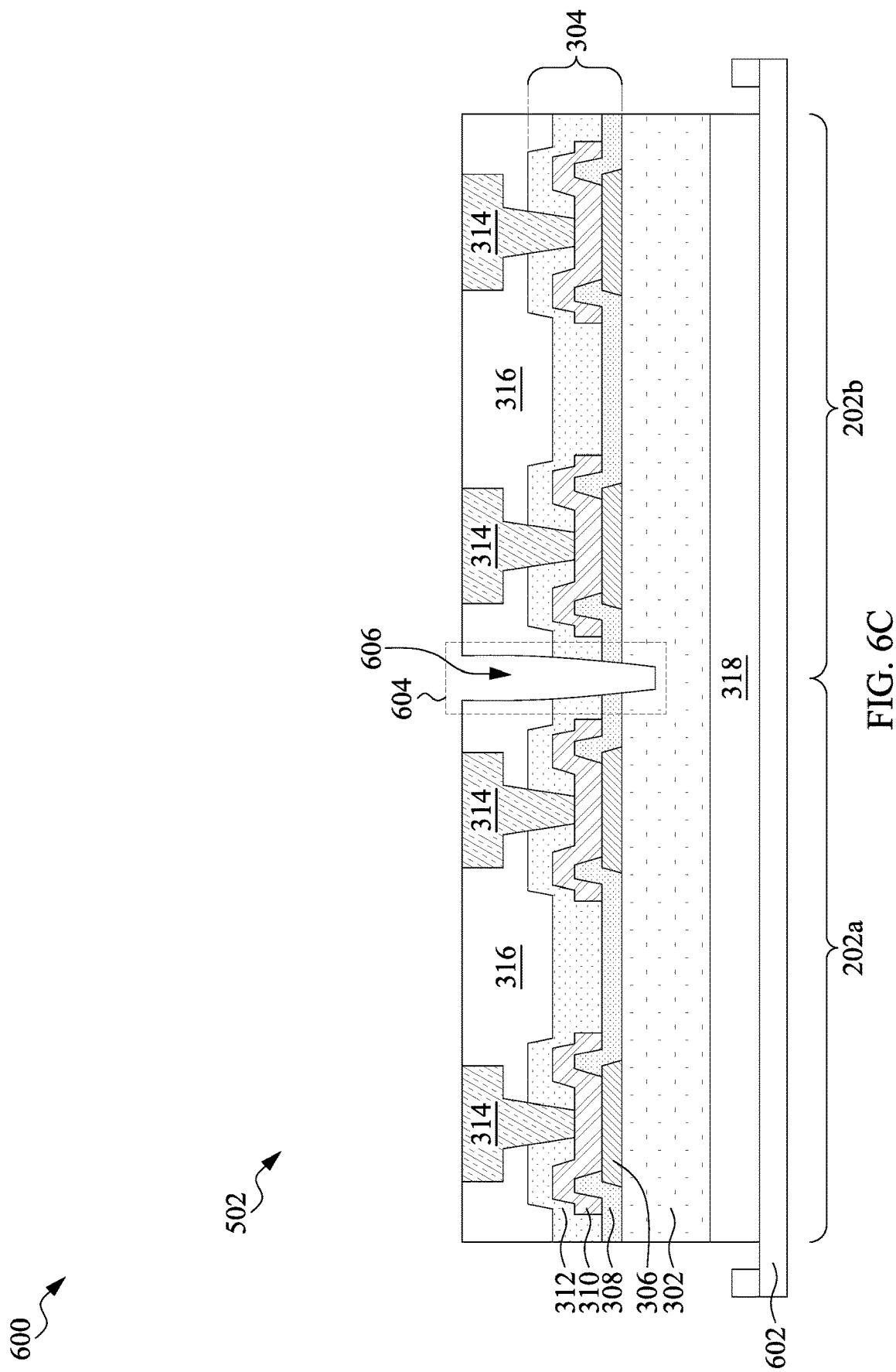

As shown in FIG. 6C, one or more grooves 606 are formed in the wafer 502 in the singulation operation. The singulation tool set 125 may form the one or more grooves 606 in the die cutting region 604 between the semiconductor die package 202a and the semiconductor die package 202b. The singulation tool set 125 may perform a laser drilling operation and/or another type of operation to form the one or more grooves 606.

Figure 6D:
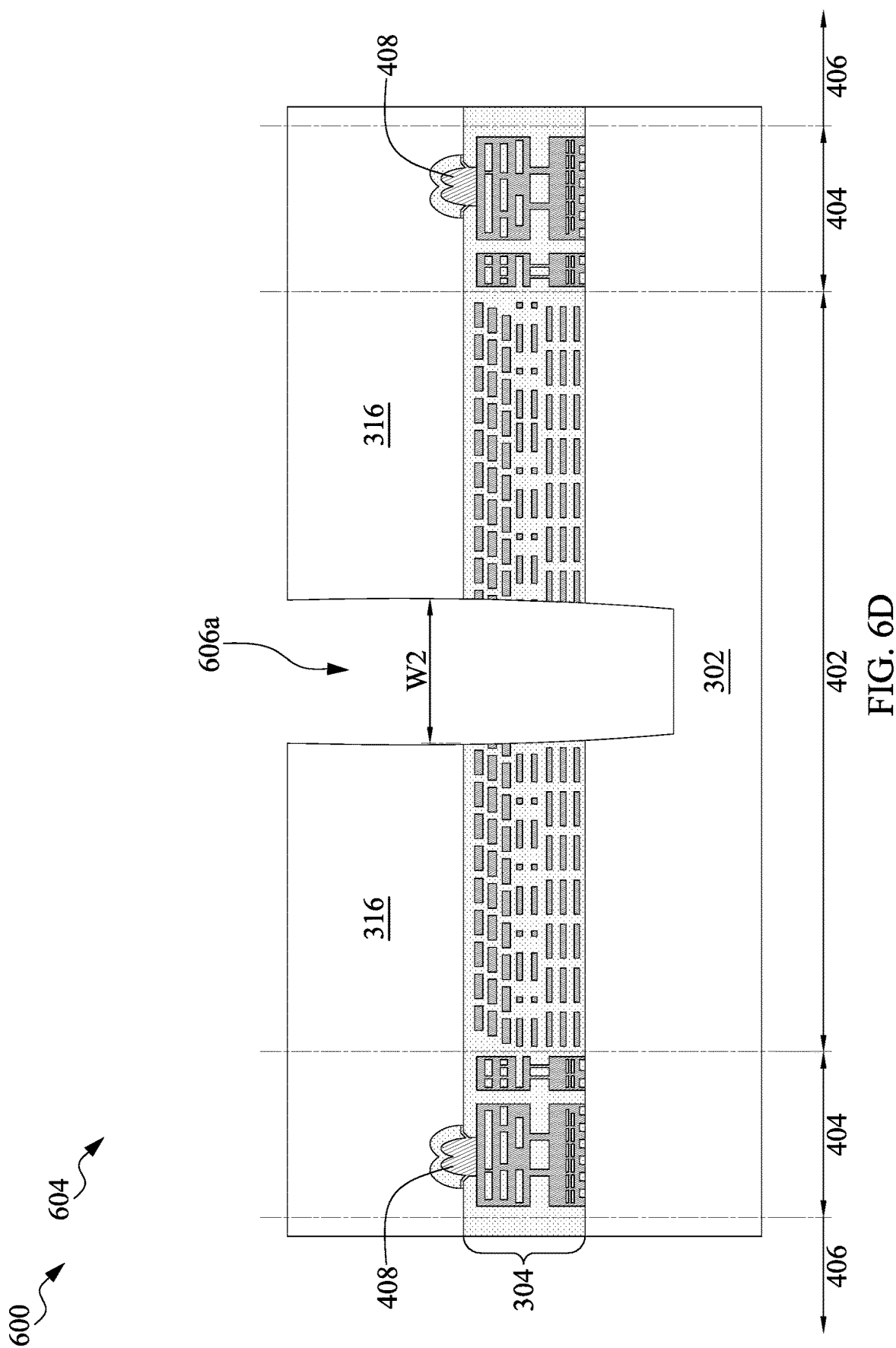
Figure 6E:
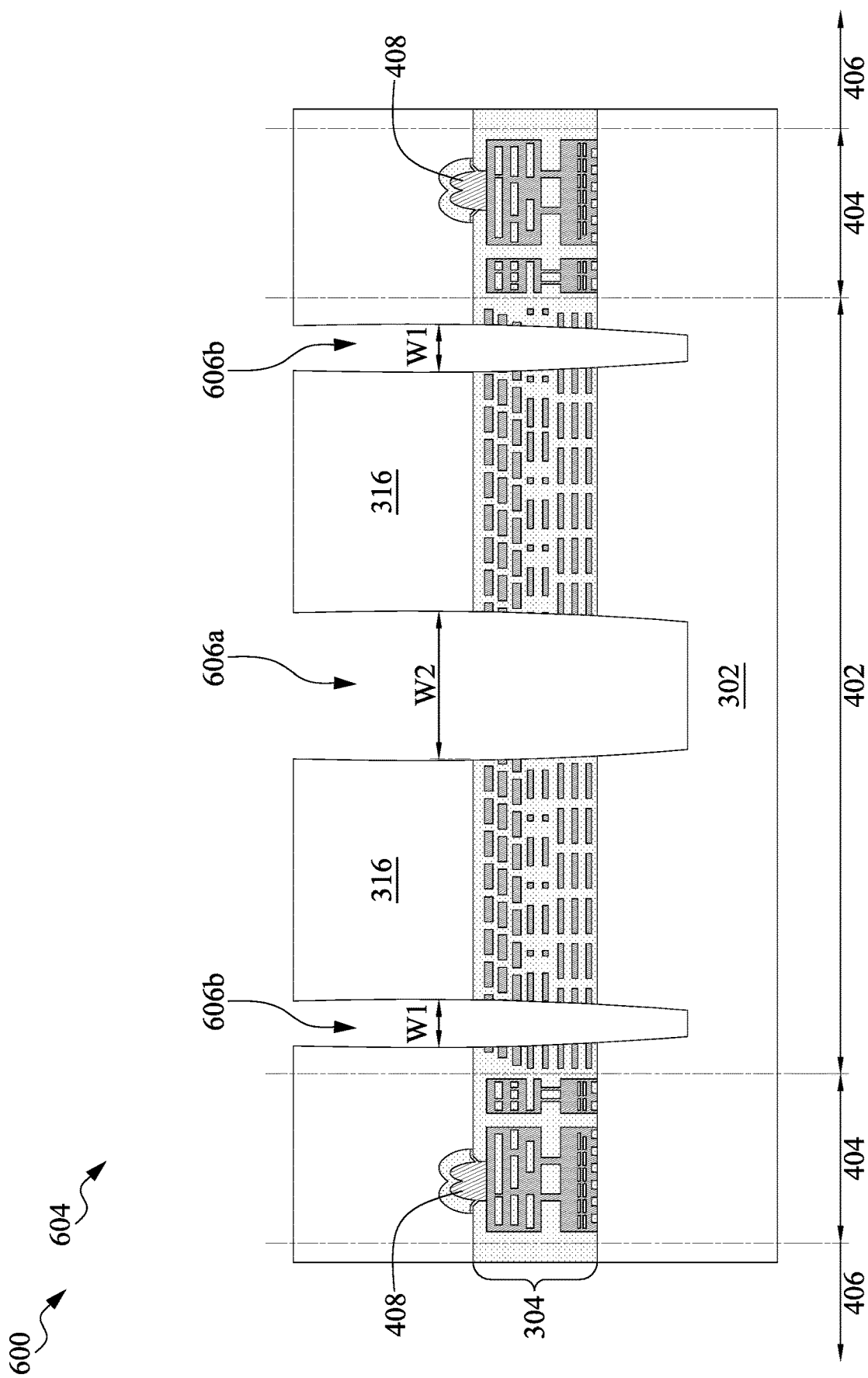

FIGS. 6D and 6E illustrate an example process for forming the one or more grooves 606 in the die cutting region 604. As shown in FIG. 6D, the singulation tool set 125 may form a wide groove (or wide recess) 606a in the scribe line region 402. The wide groove 606a may be formed through the insulator layer 316 through the connection structure 304, and into a portion of the semiconductor die(s) 302. The width W2 may be greater than approximately 30 microns such that a blade saw that is used to fully cut through the wide groove 606a can fit in the wide groove 606a without touching the sidewalls of the wide groove 606a, which might otherwise result in damage to the connection structure 304. However, other values for the width W2 are within the scope of the present disclosure. The height of the wide groove 606a may correspond to the height H2 of the curved portion 412 of the outer edge 410 of the semiconductor die package 202.

As shown in FIG. 6E, the singulation tool set 125 may form a plurality of narrow grooves 606b in the scribe line region 402. A narrow groove 606b may be formed on a first side of the wide groove 606a, and another narrow groove 606b may be formed on a second side of the wide groove 606a opposing the first side. In this way, narrow grooves 606b are formed in each of the semiconductor die packages 202a and 202b.

The width W1 of the narrow grooves 606b may be less than the width W2 of the wide groove 606a. The height of the narrow grooves 606b may correspond to the height H1 of the stress relief trench 416 in the semiconductor die package 202. In some implementations, the narrow grooves 606b are formed to a width W1 that is included in a range of approximately 5 microns to approximately 20 microns. However, other values for the range are within the scope of the present disclosure. In some implementations, the narrow grooves 606b are formed to a same width and/or to a same height. In some implementations, two or more narrow grooves 606b are formed to different widths and/or different heights. In some implementations, the wide groove 606a and the narrow grooves 606b are formed to a same height. In some implementations, one or more narrow grooves 606b and the wide groove 606a are formed to different heights.

FIGS. 6D and 6E illustrate an example process in which the wide groove 606a is formed first, and the narrow grooves 606b are formed after the wide groove 606a. However, in other implementations, the narrow grooves 606b are formed first, and the wide groove 606a is formed after the narrow grooves 606b. Alternatively, a first subset of narrow grooves 606b may be formed prior to formation of the wide groove 606a, and a second subset of narrow grooves 606b may be formed after formation of the wide groove 606a.

Figure 6F:
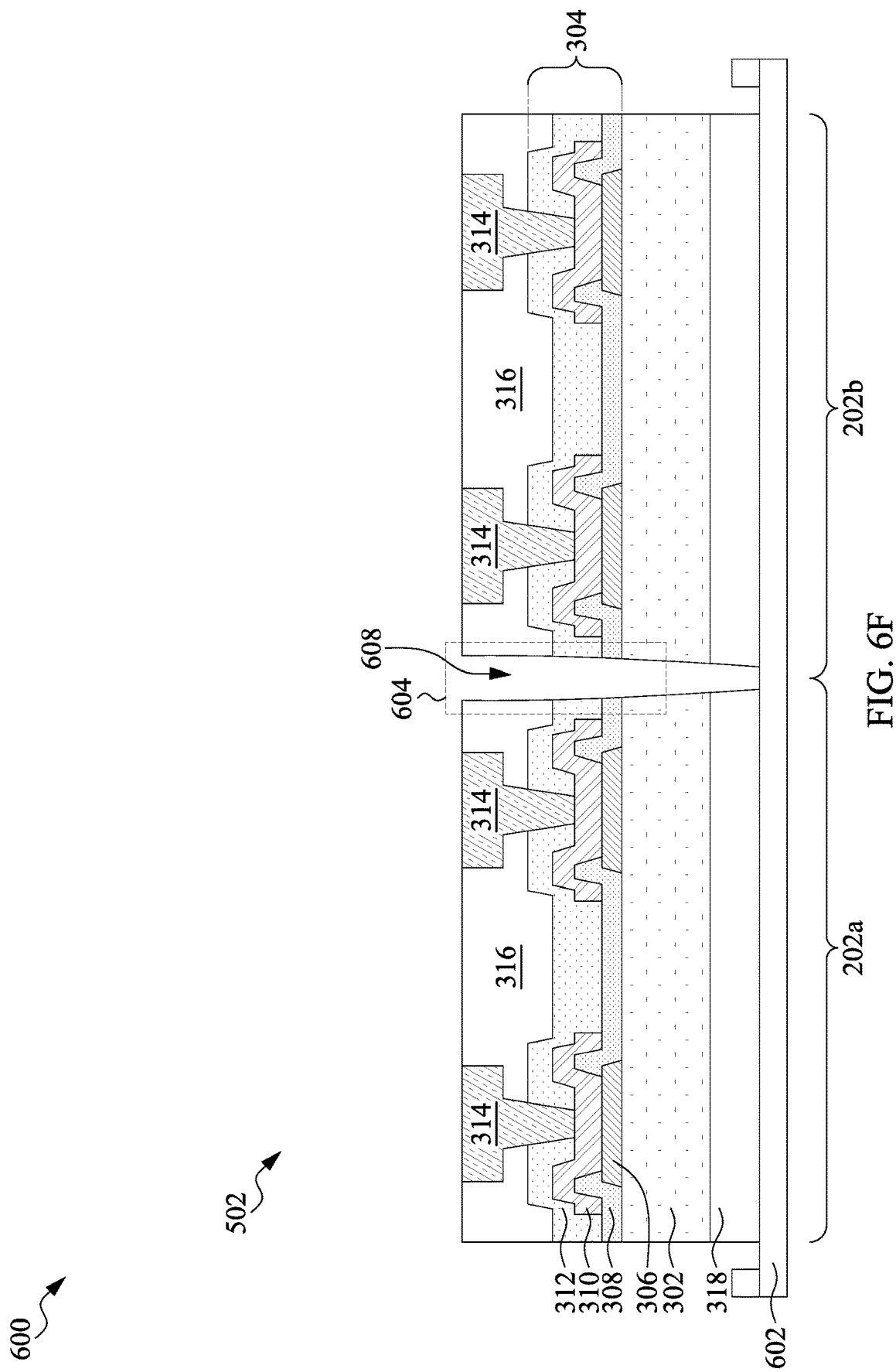

As shown in FIG. 6F, a cut line 608 may be formed through the full thickness of the wafer 502. The singulation tool set 125 may form the cut line 608 through the full thickness of the wafer 502 in the die cutting region 604 to dice or cut the wafer 502 into individual semiconductor die packages 202, including the semiconductor die package 202a and the semiconductor die package 202b. In some implementations, the singulation tool set 125 uses a blade saw or another suitable tool to cut through the wafer 502.

Figure 6G:
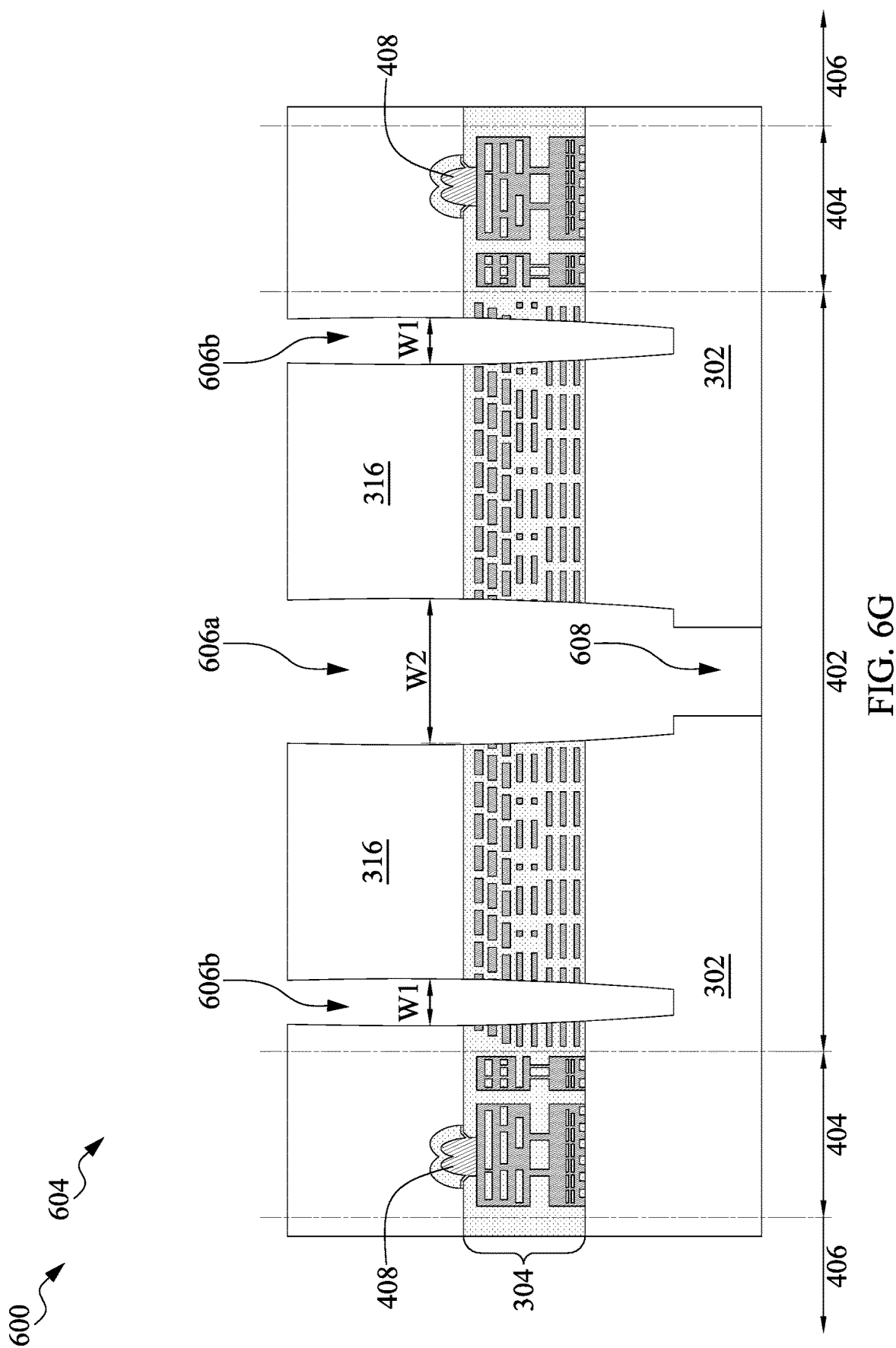

FIG. 6G illustrates a detailed view of the die cutting region 604 after the operation to form the cut line 608. As shown in FIG. 6G, the cut line 608 is formed in the scribe line region 402. In particular, the cut line 608 may be formed through the wide groove 606a.

As indicated above, FIGS. 6A-6G are provided as an example. Other examples may differ from what is described with regard to FIGS. 6A-6G.

FIGS. 7A-7H are diagrams of an example implementation 700 described herein. In particular, the example implementation 700 includes an example of forming a portion of a semiconductor device package 200 described herein. In some implementations, the operations described in connection with FIGS. 7A-7H may be performed after one or more operations described in connection with FIGS. 5A-5I and/or FIGS. 6A-6G.

Figure 7A:
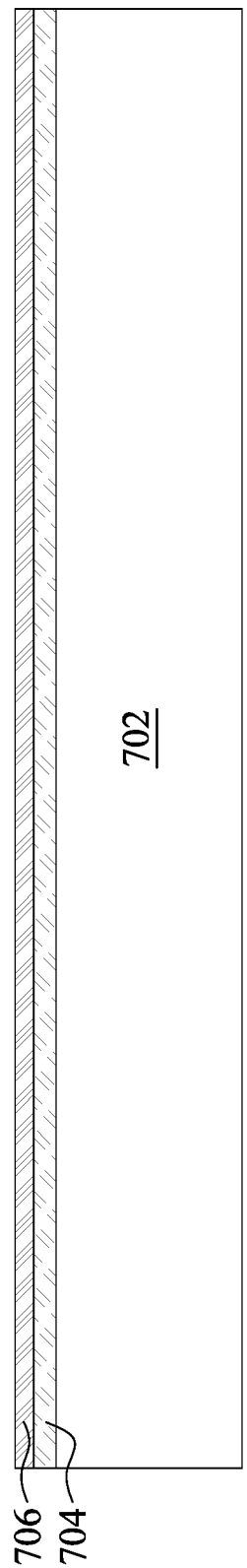
FIGS. 7A-7H are diagrams of an example implementation described herein.

As shown in FIG. 7A, one or more layers may be formed on a carrier substrate 702. The carrier substrate 702 may include a glass substrate, a silicon substrate, and/or another suitable carrier substrate. The one or more layers may include a light-to-heat conversion (LTHC) release layer 704 that is formed over and/or on the carrier substrate 702, and an adhesion layer 706 that is formed over and/or on the LTHC release layer 704. The adhesion layer 706 is configured to adhere the semiconductor device package 200 to the carrier substrate 702 for processing. The LTHC release layer 704 is configured to enable the semiconductor device package 200 to be removed or debonded from the carrier substrate 702 after processing.

Figure 7B:
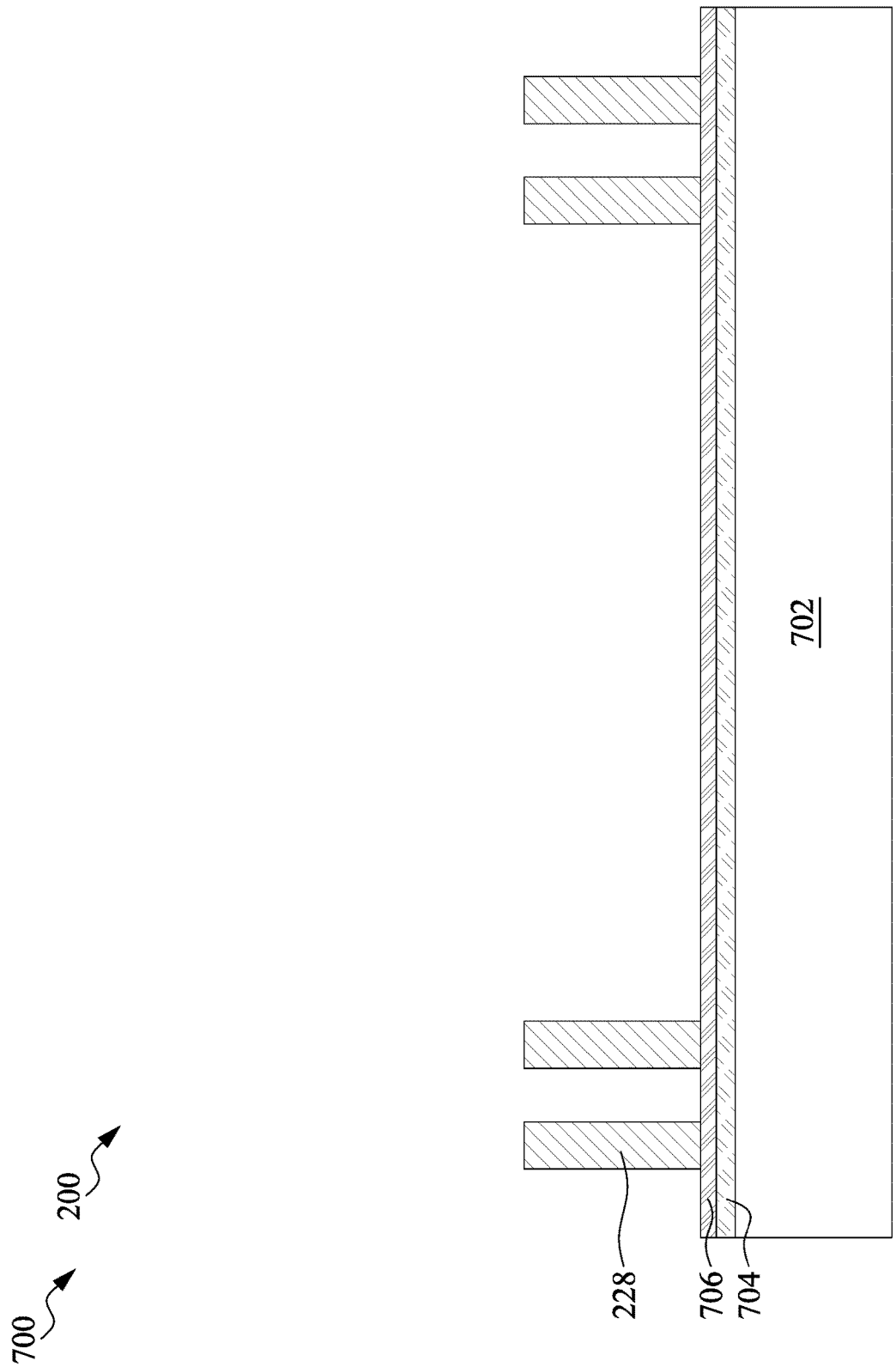

As shown in FIG. 7B, TIVs 228 of the semiconductor device package 200 may be formed over and/or on the carrier substrate 702. The connection tool set 115 may form the TIVs 228. Forming the TIVs 228 may include a plurality of processing operations. A seed layer may be formed over and/or on the adhesion layer 706. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The pattern of the photoresist may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the TIVs 228.

The photoresist and portions of the seed layer on which the conductive material is not formed may be subsequently removed. The photoresist may be removed in an ashing operation or a stripping operation. Once the photoresist is removed, exposed portions of the seed layer may be removed by etching process, such as by wet or dry etching such that the only remaining portions of the seed layer are under the TIVs 228.

Figure 7C:
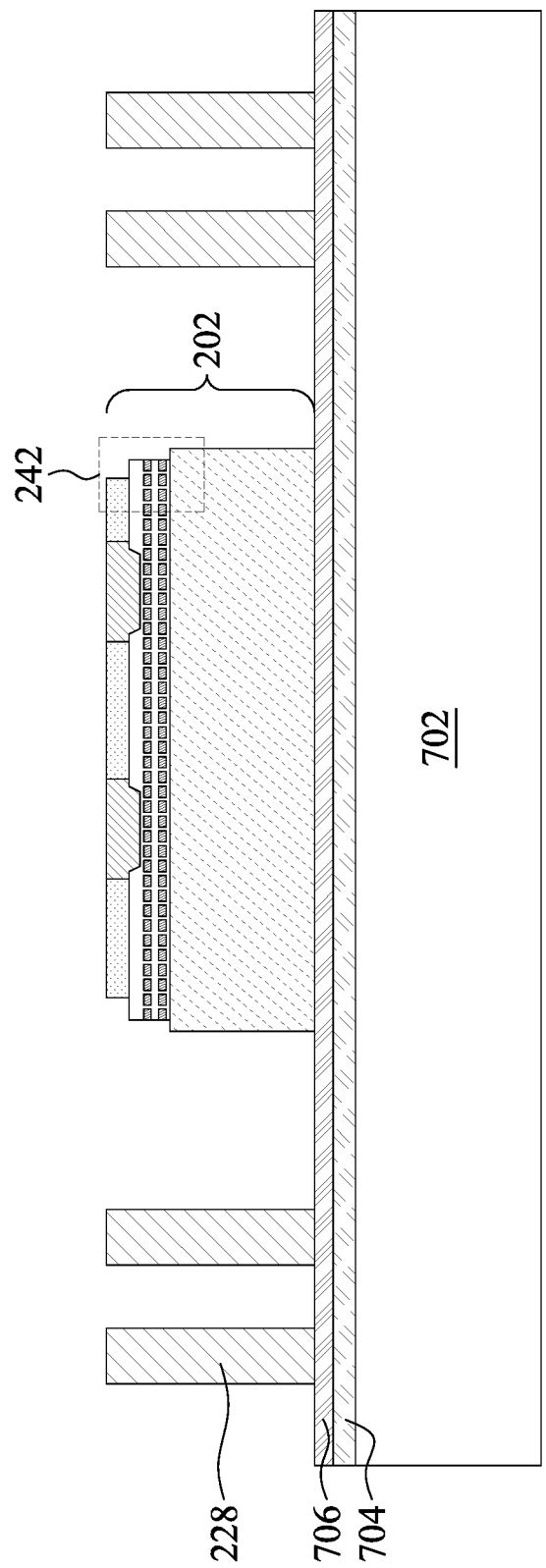

As shown in FIG. 7C, a semiconductor die package 202 (e.g., the semiconductor die package 202a, the semiconductor die package 202b) may be attached to the carrier substrate 702 between the TIVs 228. In some implementations, die-attach tool set 130 may attach the semiconductor die package 202 to the adhesion layer 706 such that the semiconductor die(s) 302 of the semiconductor die package 202 are facing the carrier substrate 702, and such that the connectors 314 are facing away from the carrier substrate 702.

Figure 7D:
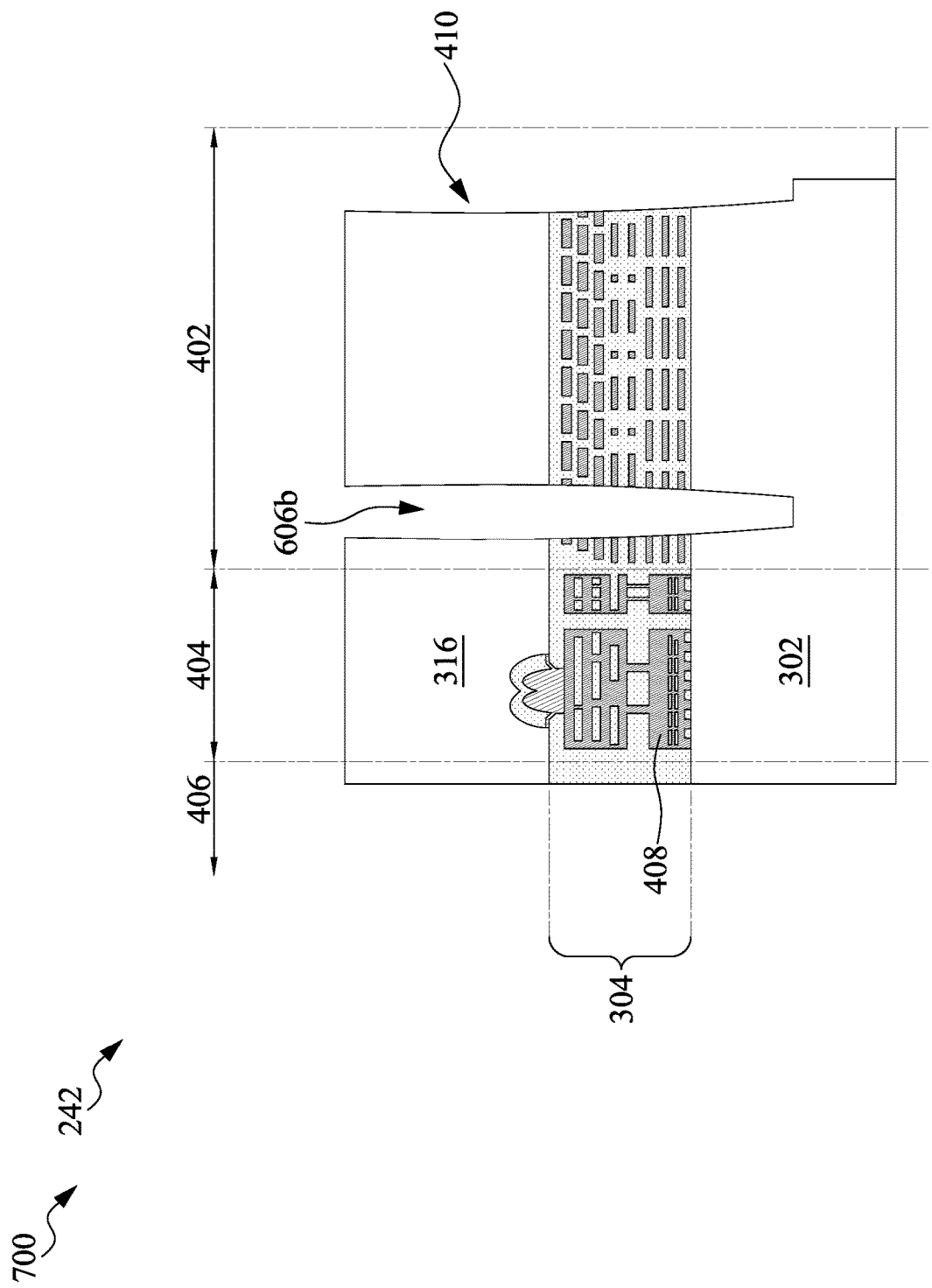

FIG. 7D illustrates a detailed view of the semiconductor die package 202 in the end portion 242 indicated in FIG. 7C. As shown in in FIG. 7D, the narrow groove 606b is included in the scribe line region 402 of the semiconductor die package 202. The narrow groove 606b is spaced away from the outer edge 410 of the semiconductor die package 202. The outer edge 410 of the semiconductor die package 202 is curved as a result of the formation of the wide groove 606a during the singulation operation to dice or cut the wafer 502 into individual semiconductor die packages 202.

Figure 7E:
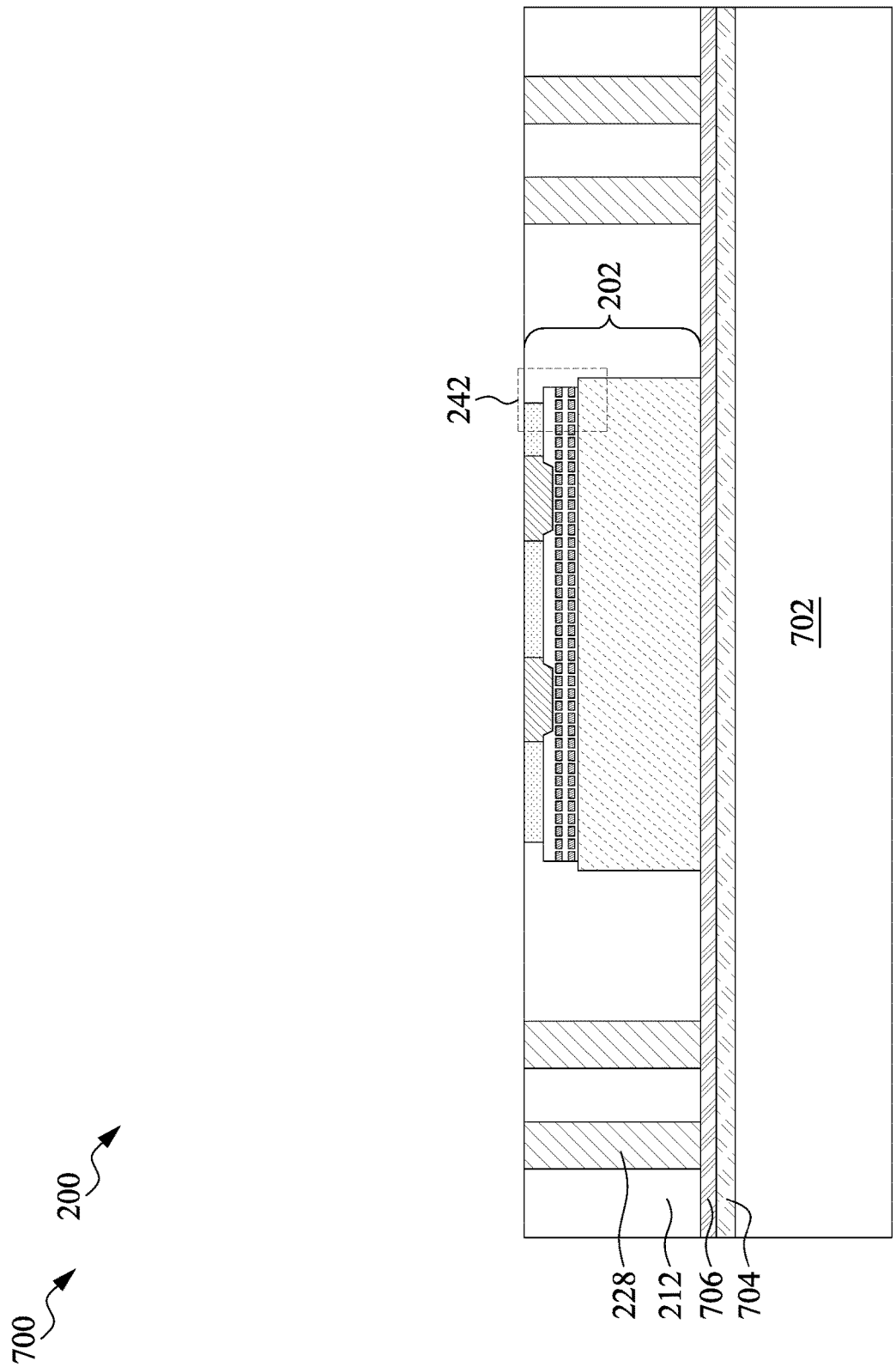

As shown in FIG. 7E, the encapsulation layer 212 may be formed over the carrier substrate 702. The encapsulation tool set 135 may deposit the molding compound of the encapsulation layer 212 around the TIVs 228 and around the semiconductor die package 202 such that the TIVs 228 and the semiconductor die package 202 are encapsulated and/or surrounded by the encapsulation layer 212.

The encapsulation tool set 135 may deposit the encapsulation layer 212 by compression molding, transfer molding, or by another suitable technique. The molding compound of the encapsulation layer 212 may be applied in liquid or semi-liquid form and then subsequently cured. In some implementations, the planarization tool set 110 may perform a planarization operation to remove and planarize an upper surface of the encapsulation layer 212 that is formed over the tops of the TIVs 228 and/or over the top of the semiconductor die package 202. The planarization operation may include a CMP operation, a grinding operation, an etching operation, and/or another suitable process.

Figure 7F:
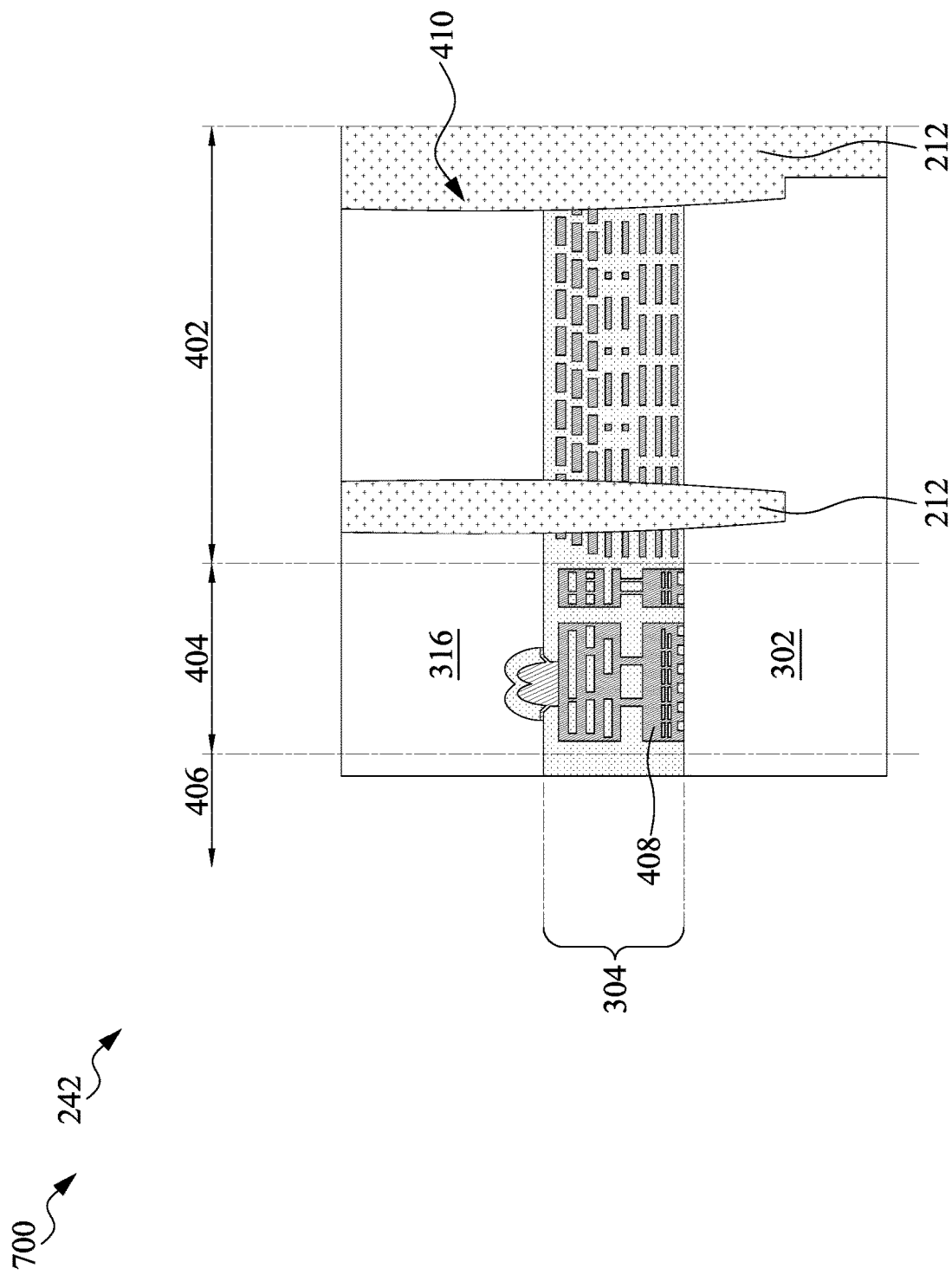

FIG. 7F illustrates a detailed view of the semiconductor die package 202 in the end portion 242 indicated in FIG. 7E. As shown in in FIG. 7F, the narrow groove 606b is filled in with the molding compound of the encapsulation layer 212. This results in the formation of the stress relief trench 416 in the scribe line region 402 between the seal ring region 404 of the semiconductor die package 202 and the outer edge 410 of the semiconductor die package 202. As further shown in FIG. 7F, the outer edge 410 is surrounded by the encapsulation layer 212.

In some implementations, the ATE tool set 120 may perform one or more reliability tests on the semiconductor device package 200. The one or more reliability tests may result in the molding compound of the encapsulation layer 212 being exposed to high temperatures and/or high humidity levels. The high temperatures and/or high humidity levels during the one or more reliability tests may cause the encapsulation layer 212 to swell and/or expand. The swelling and/or expansion of the encapsulation layer 212 around the outer edge 410 of the semiconductor die package 202 may result in stress being transferred to the connection structure 304 in the scribe line region 402 of the semiconductor die package. The transfer of stress may cause delamination and/or cracking to occur in the scribe line region 402. The delamination and/or cracking may originate at or near the outer edge 410, and may propagate through the scribe line region 402 to the stress relief trench 416. Due to the small amount of molding compound in the stress relief trench 416, the magnitude of stress that is transferred to the semiconductor die package 202 in the stress relief trench 416 is relatively small. This not only prevents the delamination and/or cracking in the scribe line region 402 from continuing to propagate through the seal ring structure 408 in the seal ring region 404 and into the active region 406 of the semiconductor die package 202, but also may prevent delamination and/or cracking from originating in the stress relief trench 416.

Figure 7G:
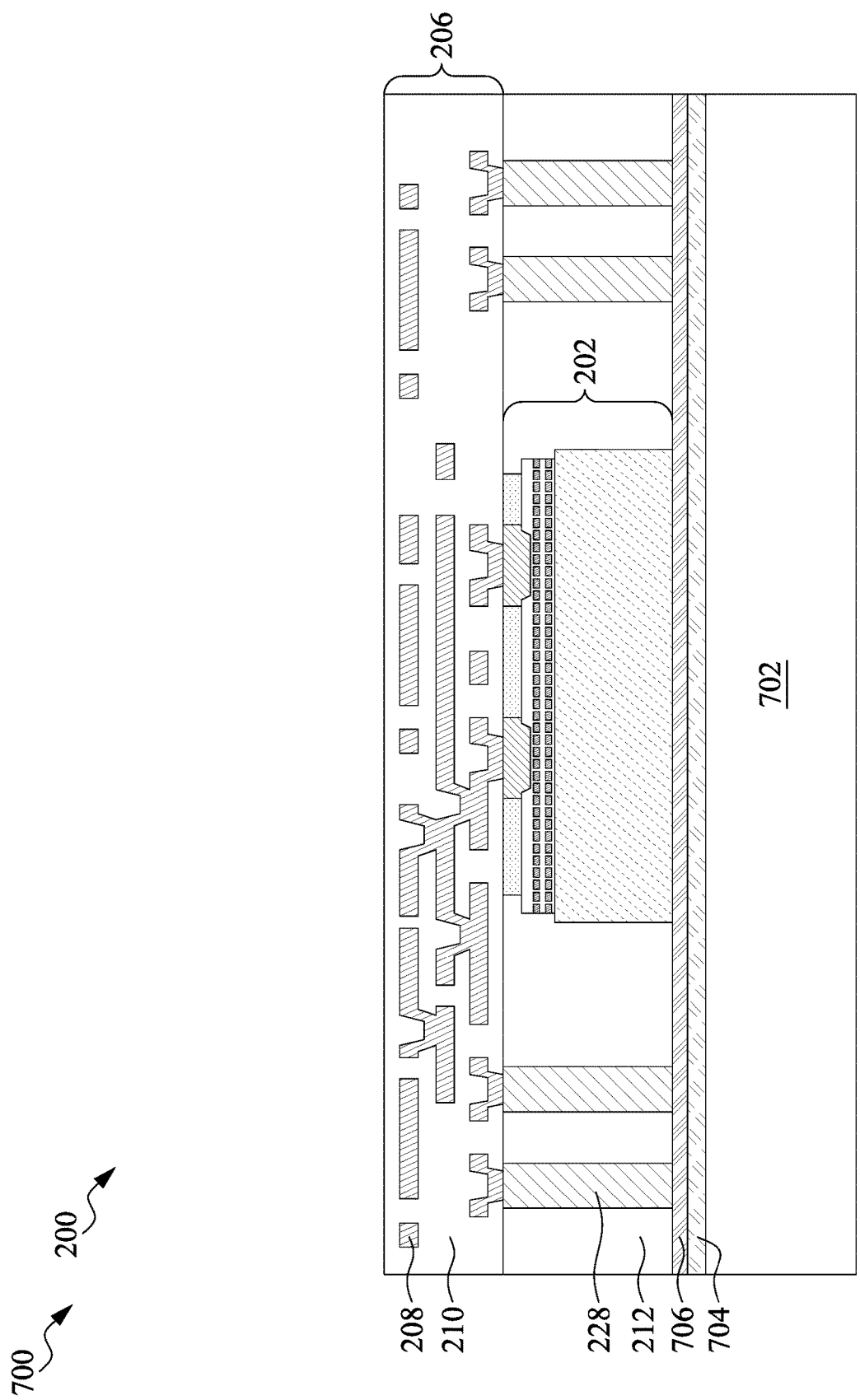

As shown in FIG. 7G, the semiconductor device package substrate 206 may be formed over and/or on the semiconductor die package 202, over and/or on the TIVs 228, and over and/or on the encapsulation layer 212. The RDL tool set 105 may form the semiconductor device package substrate 206 by forming a plurality of dielectric layers 210 and a plurality of metallization layers 208 in the plurality of dielectric layers 210. For example, the RDL tool set 105 may deposit a first dielectric layer 210, may remove portions of the first dielectric layer 210 to form recesses in the first dielectric layer 210, and may form a first metallization layer 208 in the recesses. The RDL tool set 105 may continue to perform similar processing operations to build the semiconductor device package substrate 206 until a sufficient or desired arrangement of metallization layers 208 is achieved.

Figure 7H:
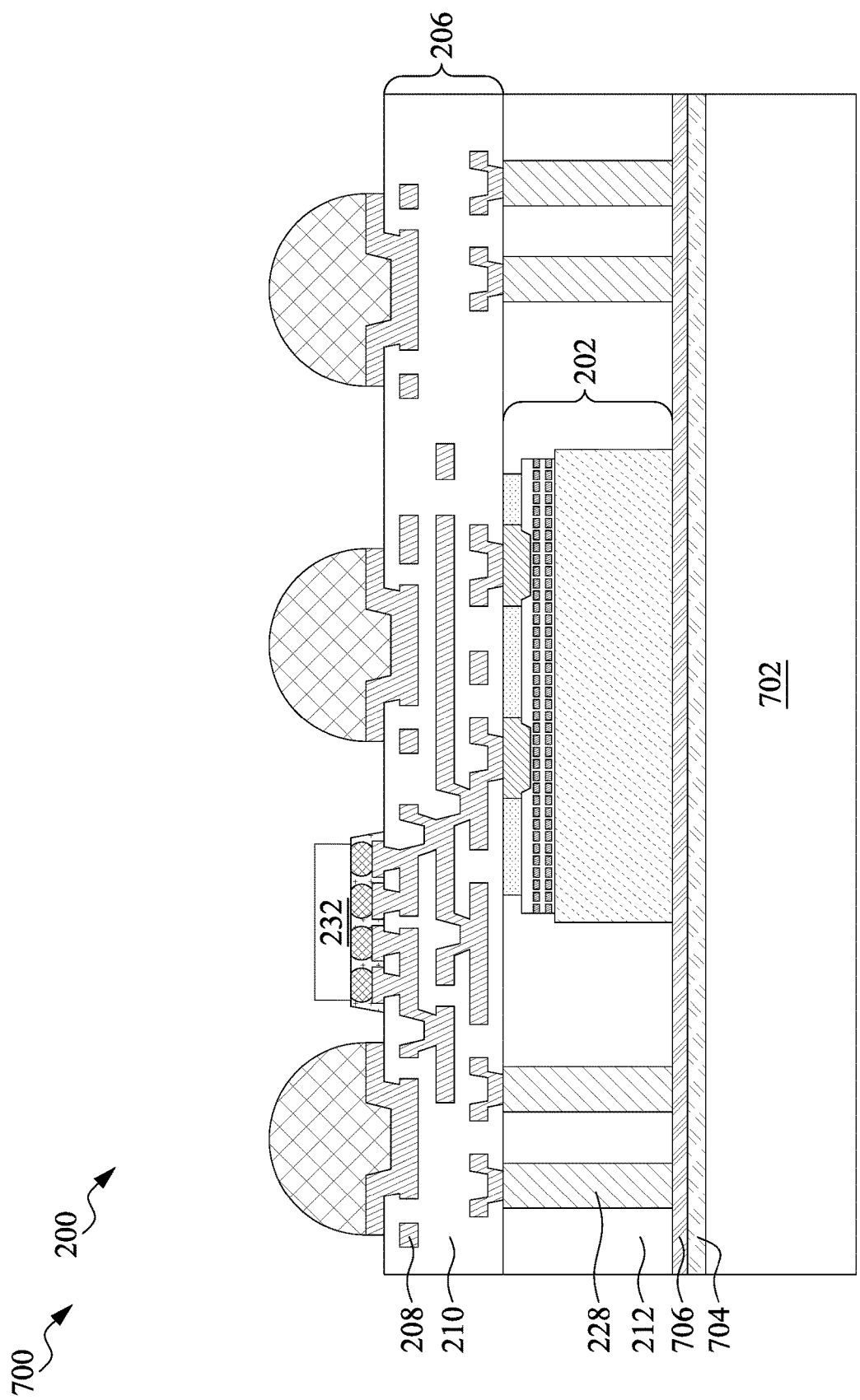

As shown in FIG. 7H, conductive terminals 238 may be formed over and/or on the semiconductor device package substrate 206. The connection tool set 115 may form conductive pads 240 on the semiconductor device package substrate 206, and may form the conductive terminals 238 on the conductive pads 240. Moreover, an IPD 232 may be attached to the semiconductor device package substrate 206 by bonding pads 234 and connectors 236.

As indicated above, FIGS. 7A-7H are provided as an example. Other examples may differ from what is described with regard to FIGS. 7A-7H.

FIGS. 8A-8F are diagrams of an example implementation 800 described herein. In particular, the example implementation 800 includes an example of forming a portion of a semiconductor device package 200 described herein. In some implementations, the operations described in connection with FIGS. 8A-8F may be performed after one or more operations described in connection with FIGS. 5A-5I, FIGS. 6A-6G, and/or FIGS. 7A-7H.

Figure 8A:
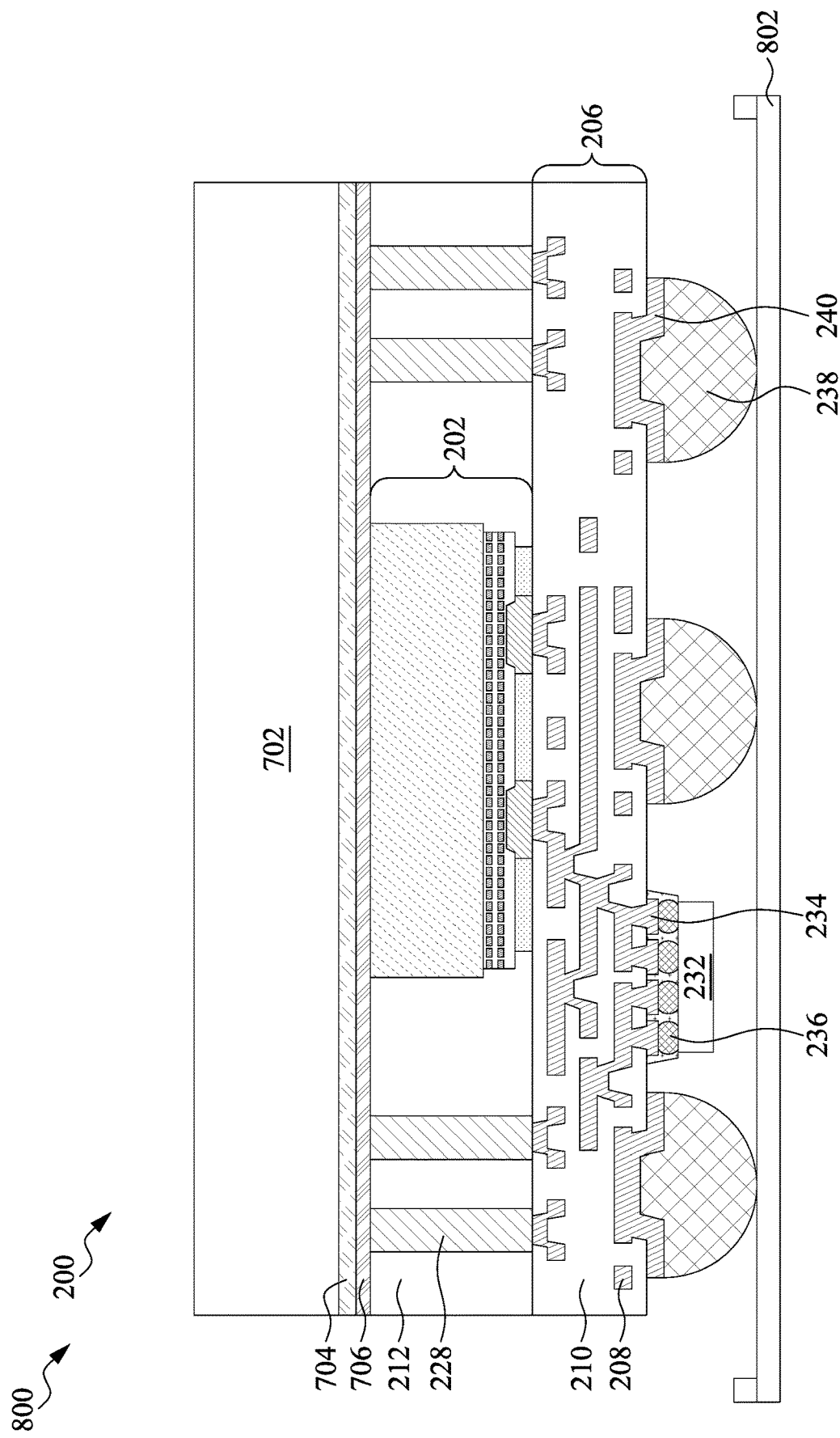
FIGS. 8A-8F are diagrams of an example implementation described herein.

As shown in FIG. 8A, the semiconductor device package 200 may be placed on a frame 802. The frame 802 may be referred to as a tape frame or another type of frame that supports the semiconductor device package 200 during processing. In some implementations, a plurality of semiconductor device packages 200 are formed on the carrier substrate 702 and subsequently placed on the frame 802 for processing. In these implementations, the frame 802 may also support the semiconductor device packages 200 during singulation to cut the semiconductor device packages 200 into individual pieces after processing.

Figure 8B:
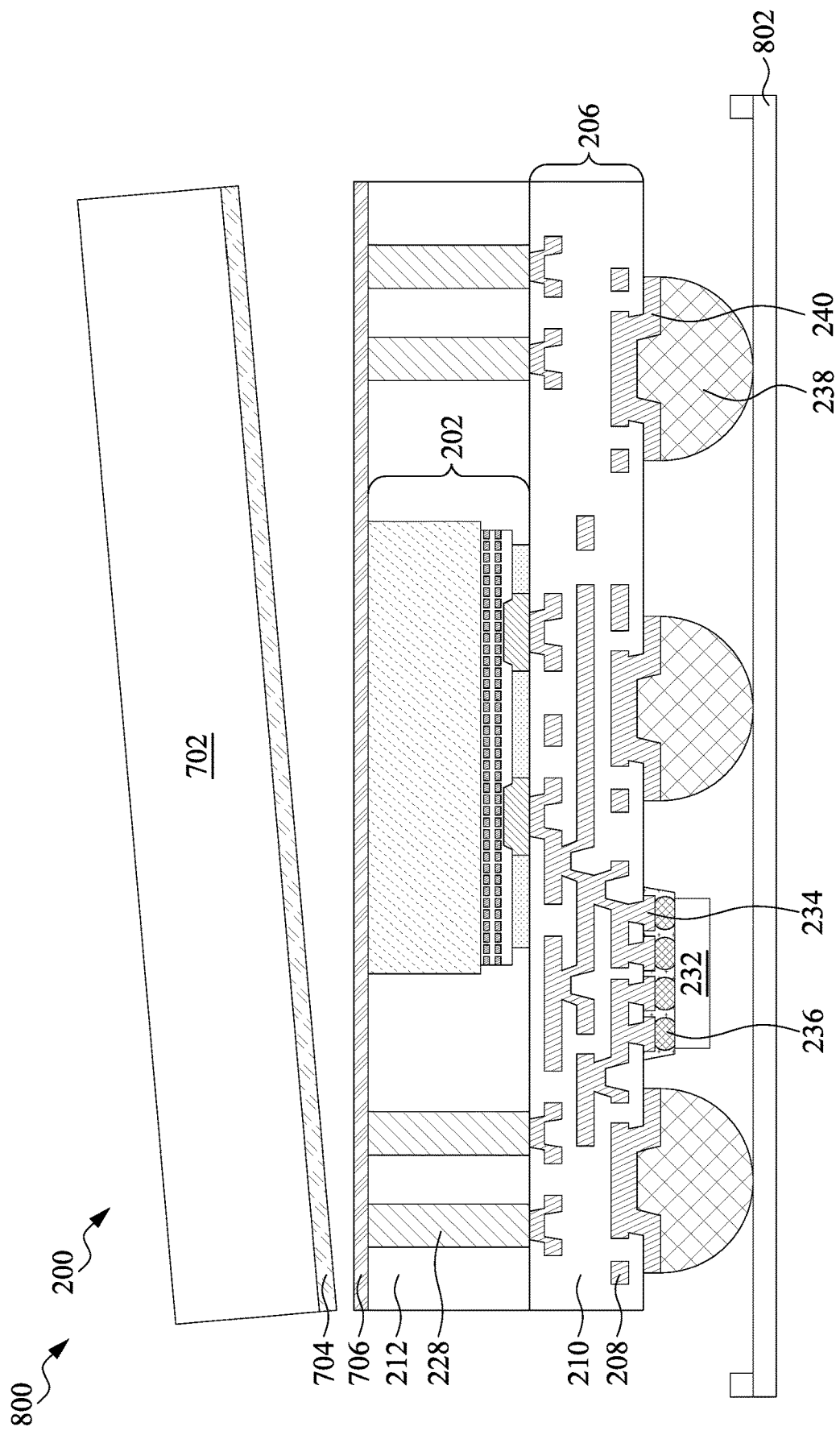

As shown in FIG. 8B, carrier substrate de-bonding is performed to detach (or "de-bond") the carrier substrate 702 from the semiconductor device package 200. The singulation tool set 125 may de-bond the carrier substrate 702 using one or more techniques, such as projecting a light (e.g., a laser light or an UV light) onto the LTHC release layer 704 between the carrier substrate 702 and the semiconductor device package 200 so that the LTHC release layer 704 decomposes under the heat of the light. This enables the carrier substrate 702 to be removed from the semiconductor device package 200. In some implementations, the adhesion layer 706 is also removed from the semiconductor device package 200. In some implementations, the adhesion layer 706 remains on the semiconductor device package 200.

Figure 8C:
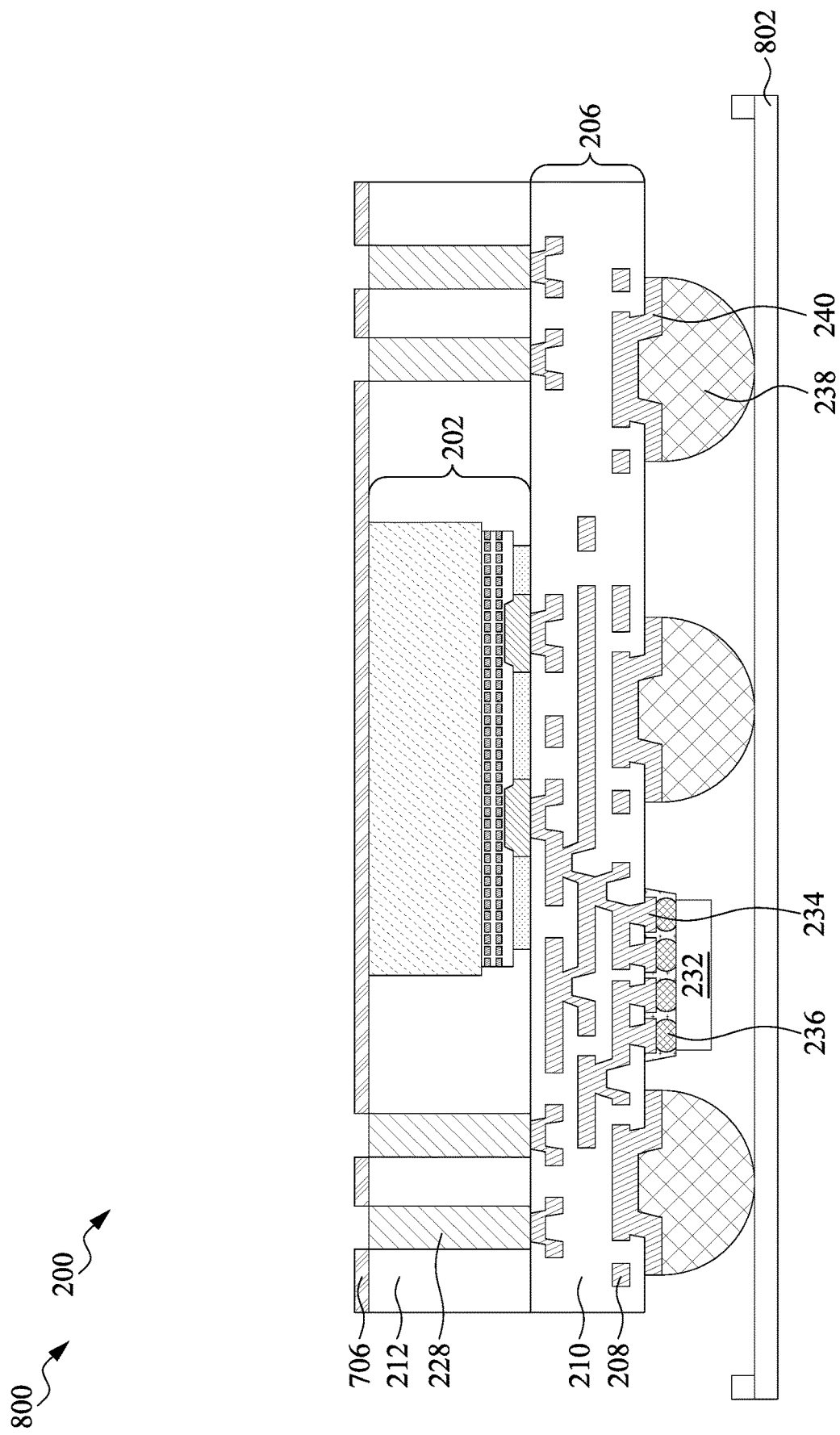
Figure 8D:
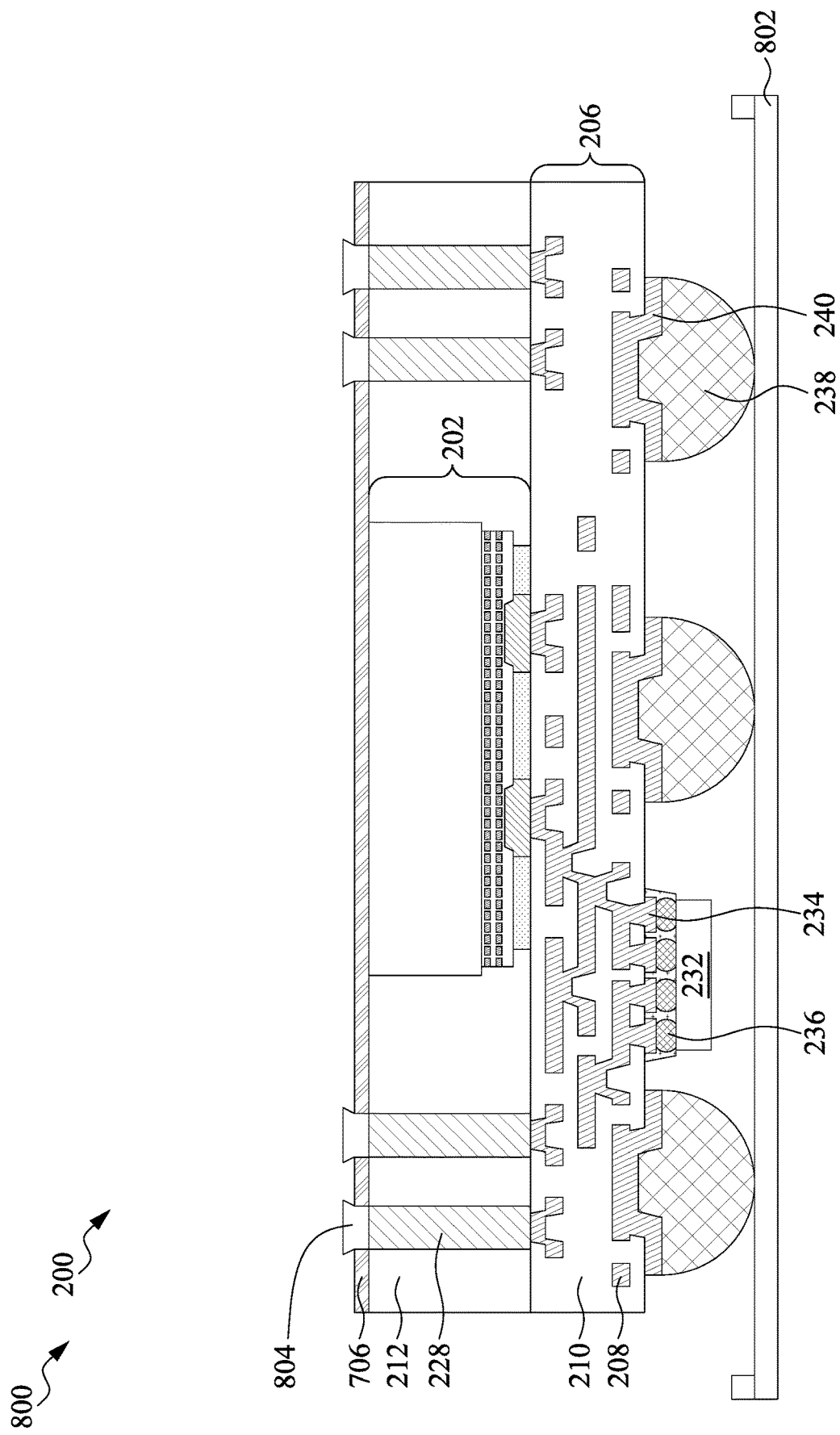

As shown in FIG. 8C, the singulation tool set 125 may perform a laser drilling operation and/or another type of operation to form openings in the adhesion layer 706 to expose the tops of the TIVs 228. As shown in FIG. 8D, solder paste 804 may be placed on the tops of the TIVs 228 in preparation for attaching a semiconductor die package 204 to the TIVs 228.

Figure 8E:
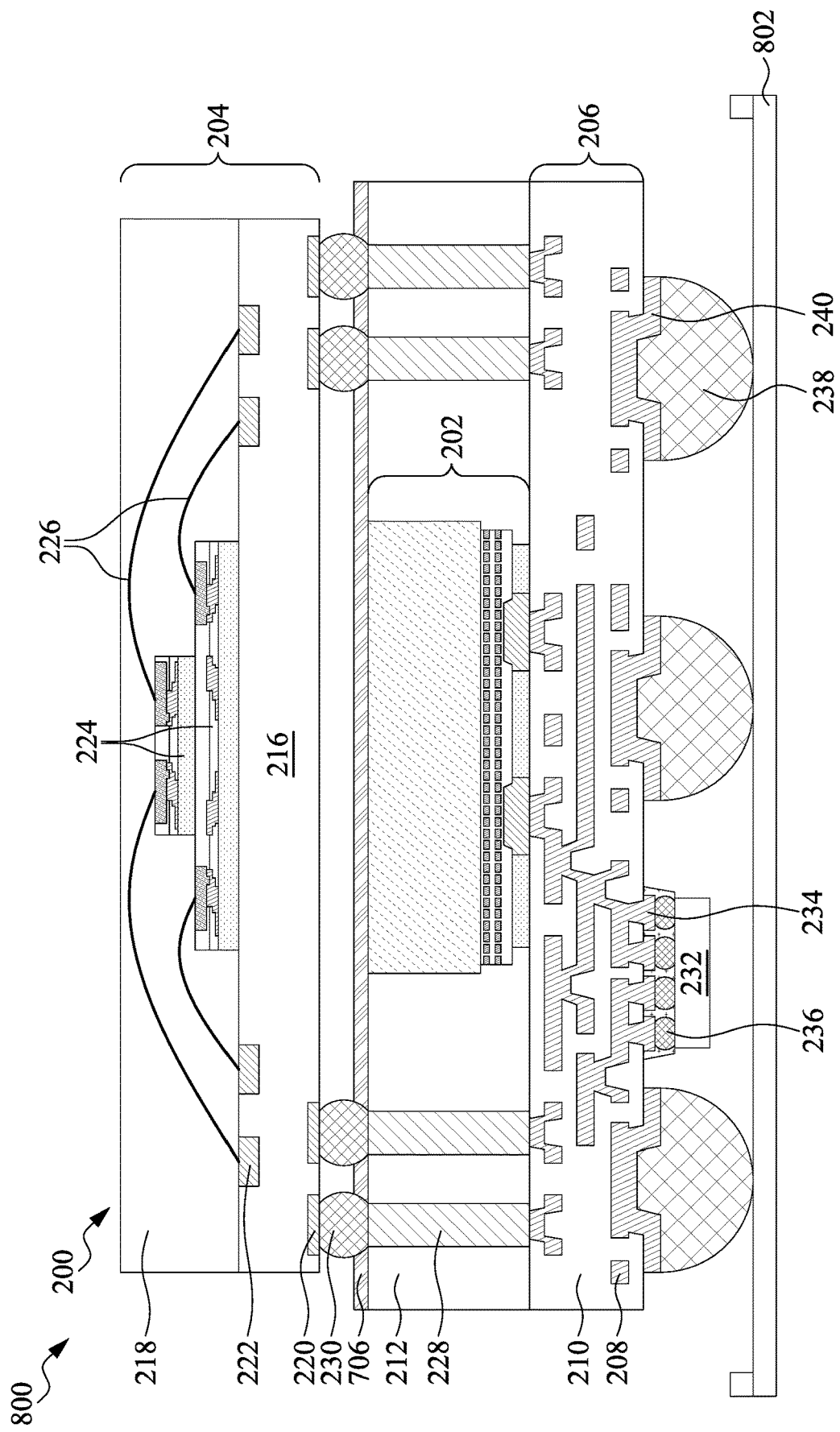

As shown in FIG. 8E, the semiconductor die package 204 may be attached to the TIVs 228 of the semiconductor device package 200. The die-attach tool set 130 may attach the semiconductor die package 204 to the TIVs 228 by placing the connectors 230 of the semiconductor die package 204 on the solder paste 804 and performing a reflow operation to cause the connectors 230 to bond with the TIVs 228.

Figure 8F:
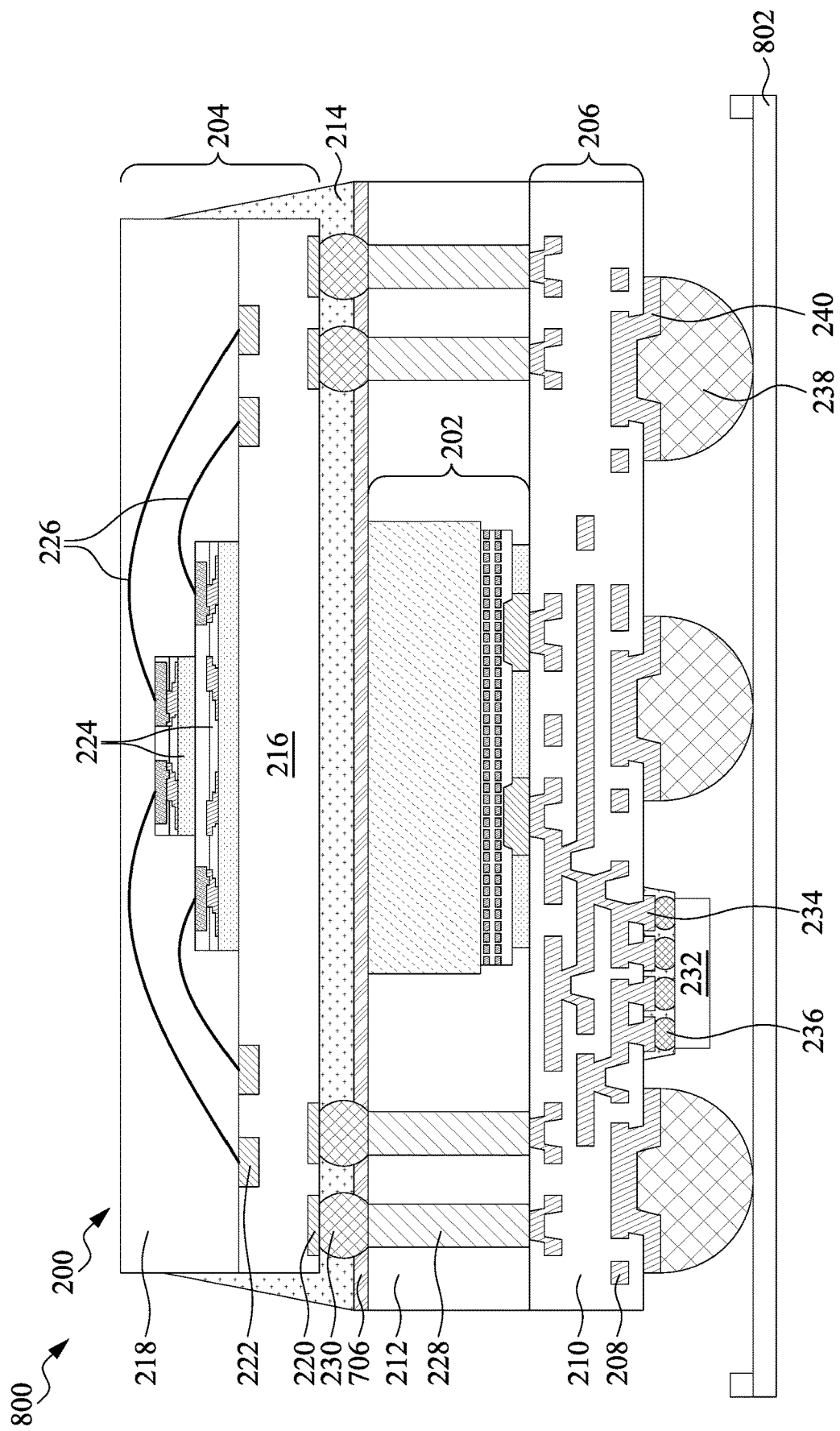

As shown in FIG. 8F, an underfill material 214 may be dispensed under the semiconductor die package 204, between the semiconductor die package 204 and the semiconductor die package 202, and around the connectors 230. The encapsulation tool set 135 may deposit the underfill material 214 in a capillary flow process, in which the capillary effect is used to deposit the underfill material 214 in between the connectors 230. Alternatively, another suitable technique may be used to deposit the underfill material 214.

As indicated above, FIGS. 8A-8F are provided as an example. Other examples may differ from what is described with regard to FIGS. 8A-8F.

Figure 9:
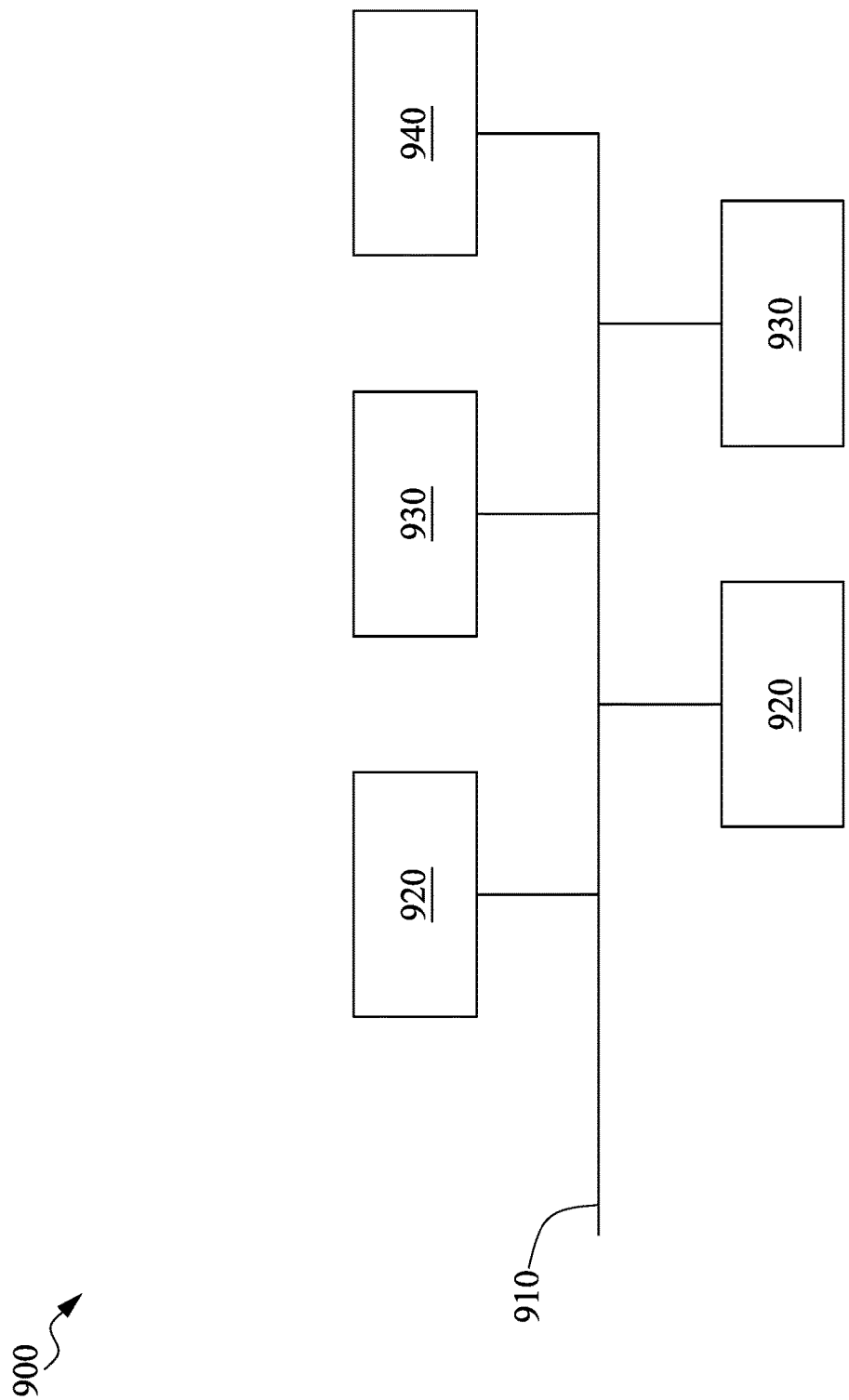
FIG. 9 is a diagram of example components of a device described herein.

FIG. 9 is a diagram of example components of a device 900. In some implementations, one or more of the semiconductor processing tool sets 105-150 and/or the transport tool set 155 may include one or more devices 900 and/or one or more components of device 900. As shown in FIG. 9, device 900 may include a bus 910, a processor 920, a memory 930, an input component 940, an output component 950, and a communication component 960.

Bus 910 may include one or more components that enable wired and/or wireless communication among the components of device 900. Bus 910 may couple together two or more components of FIG. 9, such as via operative coupling, communicative coupling, electronic coupling, and/or electric coupling. Processor 920 may include a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 may include one or more processors capable of being programmed to perform one or more operations or processes described elsewhere herein.

Memory 930 may include volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 may include one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
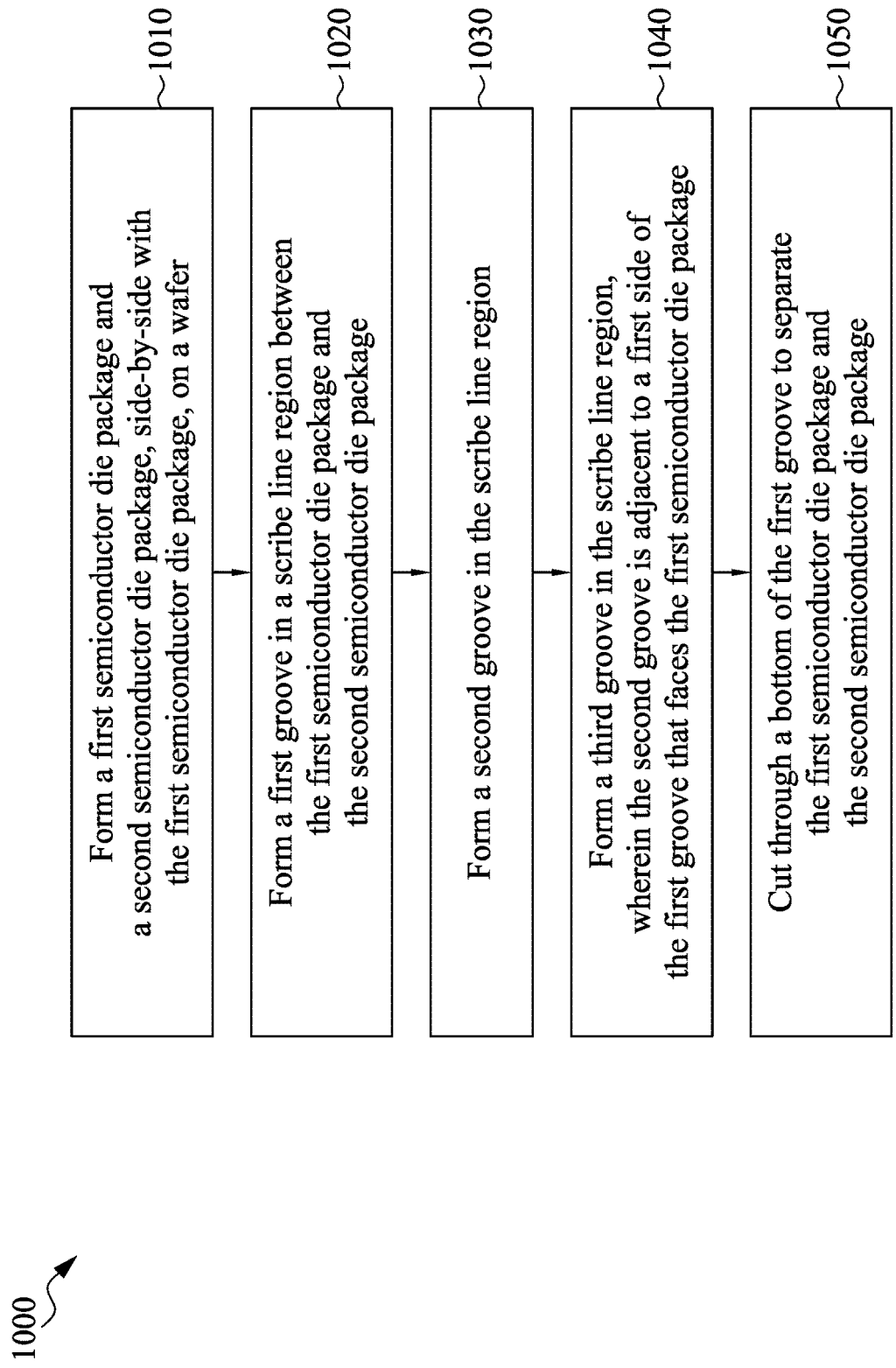
FIG. 10 is a flowchart of an example process associated with forming a semiconductor device package.

FIG. 10 is a flowchart of an example process 1000 associated with forming a semiconductor device package. In some implementations, one or more process blocks of FIG. 10 are performed by one or more semiconductor processing tool sets (e.g., one or more of the semiconductor processing tool sets 105-150). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a first semiconductor die package and a second semiconductor die package, side-by-side with the first semiconductor die package, on a wafer (block 1010). For example, one or more of the semiconductor processing tool sets 105-150 may form a first semiconductor die package 202a and a second semiconductor die package 202b, side-by-side with the first semiconductor die package 202a, on a wafer 502, as described above.

As further shown in FIG. 10, process 1000 may include forming a first groove in a scribe line region between the first semiconductor die package and the second semiconductor die package (block 1020). For example, one or more of the semiconductor processing tool sets 105-150 may form a first groove (e.g., a wide groove 606a) in a scribe line region 402 between the first semiconductor die package 202a and the second semiconductor die package 202b, as described above.

As further shown in FIG. 10, process 1000 may include forming a second groove in the scribe line region (block 1030). For example, one or more of the semiconductor processing tool sets 105-150 may form a second groove (e.g., a narrow groove 606b) in the scribe line region 402, as described above.

As further shown in FIG. 10, process 1000 may include forming a third groove in the scribe line region (block 1040). For example, one or more of the semiconductor processing tool sets 105-150 may form a third groove (e.g., a narrow groove 606b) in the scribe line region 402, as described above. In some implementations, the second groove is adjacent to a first side of the first groove that faces the first semiconductor die package 202a. In some implementations, the third groove is adjacent to a second side of the first groove that faces the second semiconductor die package 202b. In some implementations, a width W2 of the first groove is greater relative to a width W1 of the second groove. In some implementations, the width W2 of the first groove is greater relative to a width W1 of the third groove.

As further shown in FIG. 10, process 1000 may include cutting through a bottom of the first groove to separate the first semiconductor die package and the second semiconductor die package (block 1050). For example, one or more of the semiconductor processing tool sets 105-150 may cut through a bottom of the first groove to separate the first semiconductor die package 202a and the second semiconductor die package 202b, as described above.

Process 1000 may include additional implementations, such as any single implementation or any combination of implementations described below and/or in connection with one or more other processes described elsewhere herein.

In a first implementation, forming the second groove includes forming the second groove prior to forming the first groove, and forming the third groove includes forming the third groove prior to forming the first groove. In a second implementation, alone or in combination with the first implementation, forming the second groove includes forming the second groove after forming the first groove, and forming the third groove includes forming the third groove after forming the first groove. In a third implementation, alone or in combination with one or more of the first and second implementations, forming the second groove includes forming the second groove prior to forming the first groove, and forming the third groove includes forming the third groove after forming the first groove.

In a fourth implementation, alone or in combination with one or more of the first through third implementations, process 1000 includes mounting the first semiconductor die package 202a to a carrier substrate 702, forming a plurality of TIVs 228 of a semiconductor device package 200 adjacent to one or more sides of the first semiconductor die package 202a, and depositing a molding compound (e.g., of an encapsulation layer 212) around the first semiconductor die package 202a and around the plurality of TIVs 228, where the molding compound fills in the second groove to form a stress relief trench 416 in the first semiconductor die package 202a.

In a fifth implementation, alone or in combination with one or more of the first through fourth implementations, process 1000 includes performing one or more reliability tests on the semiconductor device package 200, where the stress relief trench 416 resists a transfer of stress, from the molding compound to the semiconductor device package 200, that results from swelling of the molding compound during the one or more reliability tests. In a sixth implementation, alone or in combination with one or more of the first through fifth implementations, forming the second groove includes forming the second groove to a width W1 that is included in a range of approximately 5 microns to approximately 20 microns.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, a laser grooving operation is performed to form a plurality of grooves (or recesses) in a semiconductor die prior to attaching the semiconductor die to a semiconductor device package substrate. In addition to forming a first groove through which blade sawing is to be performed to separate the semiconductor die from other semiconductor dies, a second groove may be formed between the first groove and a seal ring of the semiconductor die. The second groove is configured to contain any potential delamination to a portion of the semiconductor die between the first groove and the second groove, and prevents delamination from propagating through the seal ring and into an active region of the semiconductor die. Accordingly, the second groove and the associated laser grooving operation described herein reduce the likelihood of delamination in the semiconductor die that might otherwise be caused by swelling and/or expansion in a molding compound formed around the semiconductor die after the semiconductor die is attached to the semiconductor device package substrate. This may reduce the likelihood of failures in the semiconductor die, which may increase semiconductor device package yield.

As described in greater detail above, some implementations described herein provide a semiconductor die package. The semiconductor die package includes a semiconductor die. The semiconductor die package includes an insulator layer. The semiconductor die package includes a connection structure between the semiconductor die and the insulator layer. The semiconductor die package includes a stress relief trench between an outer edge of the semiconductor die package and a seal ring structure of the semiconductor die package, where the stress relief trench extends through the insulator layer, through the connection structure, and into a portion of the semiconductor die.

As described in greater detail above, some implementations described herein provide a method. The method includes forming a first semiconductor die package and a second semiconductor die package, side-by-side with the first semiconductor die package, on a wafer. The method includes forming a first groove in a scribe line region between the first semiconductor die package and the second semiconductor die package. The method includes forming a second groove in the scribe line region. The method includes forming a third groove in the scribe line region, where the second groove is adjacent to a first side of the first groove that faces the first semiconductor die package, where the third groove is adjacent to a second side of the first groove that faces the second semiconductor die package, where a width of the first groove is greater relative to a width of the second groove, and where the width of the first groove is greater relative to a width of the third groove. The method includes cutting through a bottom of the first groove to separate the first semiconductor die package and the second semiconductor die package.

As described in greater detail above, some implementations described herein provide a semiconductor device package. The semiconductor device package includes a semiconductor device package substrate. The semiconductor device package includes a plurality of interconnection structures attached to the semiconductor device package substrate and extending above the semiconductor device package substrate. The semiconductor device package includes a first semiconductor die package between the plurality of interconnection structures, including a stress relief trench that is included around a perimeter of the first semiconductor die package. The semiconductor device package includes an encapsulation layer that surrounds the plurality of interconnection structures and the first semiconductor die package. The semiconductor device package includes a second semiconductor die package above the plurality of interconnection structures, above the first semiconductor die package, and above the encapsulation layer, where the second semiconductor die package is attached to the plurality of interconnection structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first semiconductor die package and a second semiconductor die package, side-by-side with the first semiconductor die package, on a wafer;
    forming a first groove in a scribe line region between the first semiconductor die package and the second semiconductor die package;
    forming a second groove in the scribe line region;
    forming a third groove in the scribe line region,
        wherein the second groove is adjacent to a first side of the first groove that faces the first semiconductor die package,
        wherein the third groove is adjacent to a second side of the first groove that faces the second semiconductor die package,
        wherein a width of the first groove is greater relative to a width of the second groove, and
        wherein the width of the first groove is greater relative to a width of the third groove;
    cutting through a bottom of the first groove to separate the first semiconductor die package and the second semiconductor die package;
    mounting the first semiconductor die package to a carrier substrate; and
    depositing a molding compound around the first semiconductor die package, wherein the molding compound fills in the second groove to form a stress relief trench in the first semiconductor die package.

2. The method of claim 1, wherein forming the second groove comprises:
forming the second groove prior to forming the first groove; and
wherein forming the third groove comprises:
forming the third groove prior to forming the first groove.

3. The method of claim 1, wherein forming the second groove comprises:
forming the second groove after forming the first groove; and
wherein forming the third groove comprises:
forming the third groove after forming the first groove.

4. The method of claim 1, wherein forming the second groove comprises:
forming the second groove prior to forming the first groove; and
wherein forming the third groove comprises:
forming the third groove after forming the first groove.

5. The method of claim 1, further comprising:
forming a plurality of through integrated fanout (InFO) vias (TIVs) of a semiconductor device package adjacent to one or more sides of the first semiconductor die package; and
depositing the molding compound around the plurality of TIVs.

6. The method of claim 5, further comprising:
performing one or more reliability tests on the semiconductor device package,
wherein the stress relief trench resists a transfer of stress, from the molding compound to the semiconductor device package, that results from swelling of the molding compound during the one or more reliability tests.

7. The method of claim 1, wherein forming the second groove comprises:
forming the second groove to a width that is included in a range of microns to 20 microns.

8. A method, comprising:
forming a first semiconductor die package and a second semiconductor die package on a wafer;
forming a first groove, a second groove, and a third groove between the first semiconductor die package and the second semiconductor die package,
wherein the first groove is between the second groove and the third groove;
cutting through a full thickness of the wafer via the first groove to separate the first semiconductor die package and the second semiconductor die package;
mounting the first semiconductor die package to a carrier substrate; and
depositing a molding compound around the first semiconductor die package,
wherein the molding compound fills in the second groove to form a stress relief trench in the first semiconductor die package.

9. The method of claim 8, wherein a width of the first groove is greater than a width of the second groove.

10. The method of claim 8, wherein a width of the first groove is greater than a width of the third groove.

11. The method of claim 8, wherein a width of the first groove is greater than 30 microns.

12. The method of claim 8, wherein the first groove is formed through a connection structure of the wafer and into a portion of a semiconductor die of the wafer.

13. The method of claim 8, wherein the first groove is formed through an insulator layer of the wafer, a connection structure of the wafer, and into a portion of a semiconductor die of the wafer.

14. The method of claim 8, wherein the second groove is formed through a connection structure of the wafer and into a portion of a semiconductor die of the wafer.

15. A system, comprising:
one or more semiconductor processing tool sets configured to:
form a first semiconductor die package and a second semiconductor die package, side-by-side with the first semiconductor die package, on a wafer;
form a first groove in a scribe line region between the first semiconductor die package and the second semiconductor die package;
form a second groove in the scribe line region;
form a third groove in the scribe line region,
wherein the second groove is adjacent to a first side of the first groove that faces the first semiconductor die package,
wherein the third groove is adjacent to a second side of the first groove that faces the second semiconductor die package,
wherein a width of the first groove is greater relative to a width of the second groove, and
wherein the width of the first groove is greater relative to a width of the third groove;
cut through a bottom of the first groove to separate the first semiconductor die package and the second semiconductor die package;
mount the first semiconductor die package to a carrier substrate; and
deposit a molding compound around the first semiconductor die package,
wherein the molding compound fills in the second groove to form a stress relief trench in the first semiconductor die package.

16. The system of claim 15, wherein the one or more semiconductor processing tool sets, to form the second groove, are configured to:
form the second groove prior to the first groove being formed; and
wherein the one or more semiconductor processing tool sets, to form the third groove, are configured to:
form the third groove prior to the first groove being formed.

17. The system of claim 15, wherein the one or more semiconductor processing tool sets, to form the second groove, are configured to:
form the second groove after the first groove is formed; and
wherein the one or more semiconductor processing tool sets, to form the third groove, are configured to:
form the third groove after the first groove is formed.

18. The system of claim 15, wherein the one or more semiconductor processing tool sets, to form the second groove, are configured to:
form the second groove prior to the first groove being formed; and
wherein the one or more semiconductor processing tool sets, to form the third groove, are configured to:
form the third groove after the first groove is formed.

19. The system of claim 15, wherein the one or more semiconductor processing tool sets are further configured to:
- form a plurality of through integrated fanout (InFO) vias (TIVs) of a semiconductor device package adjacent to one or more sides of the first semiconductor die package; and
- deposit the molding compound around the plurality of TIVs.

20. The system of claim 19, wherein the one or more semiconductor processing tool sets are further configured to:
- perform one or more reliability tests on the semiconductor device package,
  - wherein the stress relief trench is configured to resist a transfer of stress, from the molding compound to the semiconductor device package, that results from swelling of the molding compound during the one or more reliability tests.

* * * * *